(12) United States Patent
Strid et al.

(10) Patent No.: US 7,443,186 B2
(45) Date of Patent: Oct. 28, 2008

(54) ON-WAFER TEST STRUCTURES FOR DIFFERENTIAL SIGNALS

(75) Inventors: Eric Strid, Portland, OR (US); Richard Campbell, Portland, OR (US)

(73) Assignee: Cascade Microtech, Inc., Beaverton, OR (US)

( * ) Notice: Subject to any disclaimer, the term of this patent is extended or adjusted under 35 U.S.C. 154(b) by 0 days.

(21) Appl. No.: 11/716,428

(22) Filed: Mar. 9, 2007

(65) Prior Publication Data

US 2007/0285112 A1    Dec. 13, 2007

Related U.S. Application Data

(60) Provisional application No. 60/813,099, filed on Jun. 12, 2006.

(51) Int. Cl.
*G01R 31/02* (2006.01)
*G01R 31/26* (2006.01)

(52) U.S. Cl. .......................... 324/763; 324/765

(58) Field of Classification Search .............. 324/754, 324/763, 765; 257/48
See application file for complete search history.

(56) References Cited

U.S. PATENT DOCUMENTS

| | | |
|---|---|---|
| 491,783 A | 2/1893 | Moyer |
| 1,337,866 A | 4/1920 | Whitacker |
| 2,142,625 A | 1/1939 | Zoethout |
| 2,376,101 A | 5/1945 | Tyzzer |
| 2,389,668 A | 11/1945 | Johnson |
| 2,545,258 A | 3/1951 | Cailloux |
| 2,762,234 A | 9/1956 | Dodd |
| 2,901,696 A | 8/1959 | Möllfors |
| 2,921,276 A | 1/1960 | Fubini |
| 6,176,091 B1 | 3/1965 | Hanson et al. |
| 3,193,712 A | 7/1965 | Harris |
| 3,218,584 A | 11/1965 | Ayer |
| 3,230,299 A | 1/1966 | Radziekowski |
| 3,262,593 A | 7/1966 | Hainer |
| 3,396,598 A | 8/1968 | Grispo |
| 3,401,126 A | 9/1968 | Miller et al. |
| 3,429,040 A | 2/1969 | Miller |
| 3,445,770 A | 5/1969 | Harmon |
| 3,484,679 A | 12/1969 | Hodgson et al. |
| 3,541,222 A | 11/1970 | Parks et al. |

(Continued)

FOREIGN PATENT DOCUMENTS

CH    607 045    11/1978

(Continued)

OTHER PUBLICATIONS

Cohn, S, "Properties of Ridge Wave Guide," Proceedings of the I.R.E., Aug. 1947, pp. 783-788.

(Continued)

*Primary Examiner*—Ha Nguyen
*Assistant Examiner*—Karen M Kusumakar
(74) *Attorney, Agent, or Firm*—Chernoff, Vilhauer, McClung & Stenzel

(57) ABSTRACT

A test structure for characterizing integrated circuits on a wafer includes a differential cell outputting a differential mode signal in response to a differential mode input signal. The probe pads of the test structure are arrayed linearly enabling placement of the test structure in a saw street between dies.

18 Claims, 6 Drawing Sheets

U.S. PATENT DOCUMENTS

| | | |
|---|---|---|
| 3,561,280 A | 2/1971 | MacPhee et al. |
| 3,573,617 A | 4/1971 | Randolph et al. |
| 3,596,228 A | 7/1971 | Reed et al. |
| 3,609,539 A | 9/1971 | Gunthert |
| 3,611,199 A | 10/1971 | Safran |
| 3,619,780 A | 11/1971 | Hoeks |
| 3,622,915 A | 11/1971 | Davo |
| 3,634,807 A | 1/1972 | Grobe et al. |
| 3,648,169 A | 3/1972 | Wiesler |
| 3,654,585 A | 4/1972 | Wickersham |
| 3,662,318 A | 5/1972 | Decuyper |
| 3,680,037 A | 7/1972 | Nellis et al. |
| 3,686,624 A | 8/1972 | Napoli et al. |
| 3,700,998 A | 10/1972 | Lee et al. |
| 3,705,379 A | 12/1972 | Bogar |
| 3,710,251 A | 1/1973 | Hagge et al. |
| 3,714,572 A | 1/1973 | Ham et al. |
| 3,725,829 A | 4/1973 | Brown |
| 3,740,900 A | 6/1973 | Youmans et al. |
| 3,766,470 A | 10/1973 | Hay et al. |
| 3,806,801 A | 4/1974 | Bove |
| 3,810,016 A | 5/1974 | Chayka et al. |
| 3,829,076 A | 8/1974 | Sofy |
| 3,833,852 A | 9/1974 | Schoch |
| 3,839,672 A | 10/1974 | Anderson |
| 3,849,728 A | 11/1974 | Evans |
| 3,858,212 A | 12/1974 | Tompkins et al. |
| 3,862,790 A | 1/1975 | Davies et al. |
| 3,866,093 A | 2/1975 | Kusters et al. |
| 3,867,698 A | 2/1975 | Beltz et al. |
| 3,930,809 A | 1/1976 | Evans |
| 3,936,743 A | 2/1976 | Roch |
| 3,952,156 A | 4/1976 | Lahr |
| 3,970,934 A | 7/1976 | Aksu |
| 3,971,610 A | 7/1976 | Buchoff et al. |
| 3,976,959 A | 8/1976 | Gaspari |
| 3,992,073 A | 11/1976 | Buchoff et al. |
| 4,001,685 A | 1/1977 | Roch |
| 4,008,900 A | 2/1977 | Khoshaba |
| 4,009,456 A | 2/1977 | Hopfer |
| 4,027,935 A | 6/1977 | Byrnes et al. |
| 4,035,723 A | 7/1977 | Kvaternik |
| 4,038,599 A | 7/1977 | Bove et al. |
| 4,038,894 A | 8/1977 | Knibbe et al. |
| 4,049,252 A | 9/1977 | Bell |
| 4,063,195 A | 12/1977 | Abrams et al. |
| 4,066,943 A | 1/1978 | Roch |
| 4,072,576 A | 2/1978 | Arwin et al. |
| 4,074,201 A | 2/1978 | Lennon |
| 4,093,988 A | 6/1978 | Scott |
| 4,099,120 A | 7/1978 | Aksu |
| 4,115,735 A | 9/1978 | Stanford |
| 4,116,523 A | 9/1978 | Coberly |
| 4,123,706 A | 10/1978 | Roch |
| 4,124,787 A | 11/1978 | Aamoth et al. |
| 4,135,131 A | 1/1979 | Larsen et al. |
| 4,151,465 A | 4/1979 | Lenz |
| 4,161,692 A | 7/1979 | Tarzwell |
| 4,177,421 A | 12/1979 | Thornburg |
| 4,184,133 A | 1/1980 | Gehle |
| 4,184,729 A | 1/1980 | Parks et al. |
| 4,216,467 A | 8/1980 | Colston |
| 4,225,819 A | 9/1980 | Grau et al. |
| 4,232,398 A | 11/1980 | Gould et al. |
| 4,251,772 A | 2/1981 | Worsham et al. |
| 4,275,446 A | 6/1981 | Blaess |
| 4,277,741 A | 7/1981 | Faxvog et al. |
| 4,280,112 A | 7/1981 | Eisenhart |
| 4,284,033 A | 8/1981 | del Rio |
| 4,284,682 A | 8/1981 | Frosch et al. |
| 4,287,473 A | 9/1981 | Sawyer |
| 4,302,146 A | 11/1981 | Finlayson et al. |
| 4,306,235 A | 12/1981 | Christmann |
| 4,312,117 A | 1/1982 | Robillard et al. |
| 4,327,180 A | 4/1982 | Chen |
| 4,330,783 A | 5/1982 | Toia |
| 4,340,860 A | 7/1982 | Teeple, Jr. |
| 4,346,355 A | 8/1982 | Tsukii |
| 4,357,575 A | 11/1982 | Uren et al. |
| 4,375,631 A | 3/1983 | Goldberg |
| 4,376,920 A | 3/1983 | Smith |
| 4,383,217 A | 5/1983 | Shiell |
| 4,401,945 A | 8/1983 | Juengel |
| 4,425,395 A | 1/1984 | Negishi et al. |
| 4,453,142 A | 6/1984 | Murphy |
| 4,468,629 A | 8/1984 | Choma, Jr. |
| 4,487,996 A | 12/1984 | Rabinowitz et al. |
| 4,515,133 A | 5/1985 | Roman |
| 4,515,439 A | 5/1985 | Esswein |
| 4,528,504 A | 7/1985 | Thornton, Jr. et al. |
| 4,552,033 A | 11/1985 | Marzhauser |
| 4,567,321 A | 1/1986 | Harayama |
| 4,588,950 A | 5/1986 | Henley |
| 4,621,169 A | 11/1986 | Petinelli et al. |
| 4,626,618 A | 12/1986 | Takaoka et al. |
| 4,641,659 A | 2/1987 | Sepponen |
| 4,642,417 A | 2/1987 | Ruthrof et al. |
| 4,646,005 A | 2/1987 | Ryan |
| 4,649,339 A | 3/1987 | Grangroth et al. |
| 4,651,115 A | 3/1987 | Wu |
| 4,652,082 A | 3/1987 | Warner |
| 4,663,840 A | 5/1987 | Ubbens et al. |
| 4,669,805 A | 6/1987 | Kosugi et al. |
| 4,673,839 A | 6/1987 | Veenendaal |
| 4,684,883 A | 8/1987 | Ackerman et al. |
| 4,684,884 A | 8/1987 | Soderlund |
| 4,685,150 A | 8/1987 | Maier |
| 4,691,163 A | 9/1987 | Blass et al. |
| 4,696,544 A | 9/1987 | Costella |
| 4,697,143 A | 9/1987 | Lockwood et al. |
| 4,705,447 A | 11/1987 | Smith |
| 4,706,050 A | 11/1987 | Andrews |
| 4,707,657 A | 11/1987 | Bøegh-Petersen |
| 4,711,563 A | 12/1987 | Lass |
| 4,713,347 A | 12/1987 | Mitchell et al. |
| 4,714,873 A | 12/1987 | McPherson et al. |
| 4,722,846 A | 2/1988 | Abe et al. |
| 4,725,793 A | 2/1988 | Igarashi |
| 4,727,319 A | 2/1988 | Shahriary |
| 4,727,391 A | 2/1988 | Tajima et al. |
| 4,727,637 A | 3/1988 | Buckwitz et al. |
| 4,734,641 A | 3/1988 | Byrd, Jr. et al. |
| 4,739,259 A | 4/1988 | Hadwin et al. |
| 4,740,764 A | 4/1988 | Gerlack |
| 4,742,571 A | 5/1988 | Letron |
| 4,744,041 A | 5/1988 | Strunk et al. |
| 4,746,857 A | 5/1988 | Sakai et al. |
| 4,749,942 A | 6/1988 | Sang et al. |
| 4,754,239 A | 6/1988 | Sedivec |
| 4,755,746 A | 7/1988 | Mallory et al. |
| 4,755,747 A | 7/1988 | Sato |
| 4,755,874 A | 7/1988 | Esrig et al. |
| 4,757,255 A | 7/1988 | Margozzi |
| 4,764,723 A | 8/1988 | Strid |
| 4,766,384 A | 8/1988 | Kleinberg et al. |
| 4,772,846 A | 9/1988 | Reeds |
| 4,780,670 A | 10/1988 | Cherry |
| 4,783,625 A | 11/1988 | Harry et al. |
| 4,788,851 A | 12/1988 | Brault |
| 4,791,363 A | 12/1988 | Logan |
| 4,793,814 A | 12/1988 | Zifcak et al. |
| 4,795,962 A | 1/1989 | Yanagawa et al. |
| 4,805,627 A | 2/1989 | Klingenbeck et al. |
| 4,810,981 A | 3/1989 | Herstein |

| Patent No. | Kind | Date | Inventor(s) | Patent No. | Kind | Date | Inventor(s) |
|---|---|---|---|---|---|---|---|
| 4,812,754 | A | 3/1989 | Tracy et al. | 5,134,365 | A | 7/1992 | Okubo et al. |
| 4,818,059 | A | 4/1989 | Kakii et al. | 5,136,237 | A | 8/1992 | Smith et al. |
| 4,827,211 | A | 5/1989 | Strid et al. | 5,138,289 | A | 8/1992 | McGrath |
| 4,831,494 | A | 5/1989 | Arnold et al. | 5,142,224 | A | 8/1992 | Smith et al. |
| 4,835,495 | A | 5/1989 | Simonutti | 5,145,552 | A | 9/1992 | Yoshizawa et al. |
| 4,837,507 | A | 6/1989 | Hechtman | 5,148,131 | A | 9/1992 | Amboss et al. |
| 4,839,587 | A | 6/1989 | Flatley et al. | 5,159,264 | A | 10/1992 | Anderson |
| 4,849,689 | A | 7/1989 | Gleason et al. | 5,159,267 | A | 10/1992 | Anderson |
| 4,853,624 | A | 8/1989 | Rabjohn | 5,159,752 | A | 11/1992 | Mahant-Shetti et al. |
| 4,853,627 | A | 8/1989 | Gleason et al. | 5,160,883 | A | 11/1992 | Blanz |
| 4,858,160 | A | 8/1989 | Strid et al. | 5,164,319 | A | 11/1992 | Hafeman et al. |
| 4,859,989 | A | 8/1989 | McPherson | 5,166,606 | A | 11/1992 | Blanz |
| 4,864,227 | A | 9/1989 | Sato | 5,172,049 | A | 12/1992 | Kiyokawa et al. |
| 4,871,883 | A | 10/1989 | Guiol | 5,172,050 | A | 12/1992 | Swapp |
| 4,871,964 | A | 10/1989 | Boll et al. | 5,172,051 | A | 12/1992 | Zamborelli |
| 4,888,550 | A | 12/1989 | Reid | 5,177,438 | A | 1/1993 | Littlebury et al. |
| 4,891,584 | A | 1/1990 | Kamieniecki et al. | 5,180,977 | A | 1/1993 | Huff |
| 4,893,914 | A | 1/1990 | Hancock et al. | 5,187,443 | A | 2/1993 | Bereskin |
| 4,894,612 | A | 1/1990 | Drake et al. | 5,198,752 | A | 3/1993 | Miyata et al. |
| 4,899,126 | A | 2/1990 | Yamada | 5,198,753 | A | 3/1993 | Hamburgen |
| 4,899,998 | A | 2/1990 | Feramachi | 5,202,558 | A | 4/1993 | Barker |
| 4,901,012 | A | 2/1990 | Gloanec et al. | 5,202,648 | A | 4/1993 | McCandless |
| 4,904,933 | A | 2/1990 | Snyder et al. | 5,207,585 | A | 5/1993 | Byrnes et al. |
| 4,904,935 | A | 2/1990 | Calma et al. | 5,214,243 | A | 5/1993 | Johnson |
| 4,906,920 | A | 3/1990 | Huff et al. | 5,214,374 | A | 5/1993 | St. Onge |
| 4,908,570 | A | 3/1990 | Gupta et al. | 5,225,037 | A | 7/1993 | Elder et al. |
| 4,912,399 | A | 3/1990 | Greub et al. | 5,227,730 | A | 7/1993 | King et al. |
| 4,916,002 | A | 4/1990 | Carver | 5,232,789 | A | 8/1993 | Platz et al. |
| 4,916,398 | A | 4/1990 | Rath | 5,233,197 | A | 8/1993 | Bowman et al. |
| 4,918,373 | A | 4/1990 | Newberg | 5,233,306 | A | 8/1993 | Misra |
| 4,918,383 | A | 4/1990 | Huff et al. | 5,245,292 | A | 9/1993 | Milesky et al. |
| 4,922,128 | A | 5/1990 | Dhong et al. | 5,266,889 | A | 11/1993 | Harwood et al. |
| 4,922,186 | A | 5/1990 | Tsuchiya et al. | 5,266,963 | A | 11/1993 | Carter |
| 4,922,912 | A | 5/1990 | Watanabe | 5,267,088 | A | 11/1993 | Nomura |
| 4,926,172 | A | 5/1990 | Gorsek | 5,270,664 | A | 12/1993 | McMurtry et al. |
| 4,929,893 | A | 5/1990 | Sato et al. | 5,274,336 | A | 12/1993 | Crook et al. |
| 4,970,386 | A | 11/1990 | Buck | 5,280,156 | A | 1/1994 | Niori et al. |
| 4,972,073 | A | 11/1990 | Lessing | 5,289,117 | A | 2/1994 | Van Loan et al. |
| 4,975,638 | A | 12/1990 | Evans et al. | 5,293,175 | A | 3/1994 | Hemmie et al. |
| 4,980,637 | A | 12/1990 | Huff et al. | 5,298,972 | A | 3/1994 | Heffner |
| 4,983,910 | A | 1/1991 | Majidi-Ahy et al. | 5,304,924 | A | 4/1994 | Yamano et al. |
| 4,987,100 | A | 1/1991 | McBride et al. | 5,313,157 | A | 5/1994 | Pasiecznik, Jr. |
| 4,988,062 | A | 1/1991 | London | 5,315,237 | A | 5/1994 | Iwakura et al. |
| 4,991,290 | A | 2/1991 | MacKay | 5,316,435 | A | 5/1994 | Monzingo |
| 4,998,062 | A | 3/1991 | Ikeda | 5,317,656 | A | 5/1994 | Moslehi et al. |
| 4,998,063 | A | 3/1991 | Miller | 5,321,352 | A | 6/1994 | Takebuchi |
| 5,001,423 | A | 3/1991 | Abrami | 5,321,453 | A | 6/1994 | Mori et al. |
| 5,003,253 | A | 3/1991 | Majidi-Ahy et al. | 5,326,412 | A | 7/1994 | Schreiber et al. |
| 5,012,186 | A | 4/1991 | Gleason | 5,334,931 | A | 8/1994 | Clarke et al. |
| 5,020,219 | A | 6/1991 | Leedy | 5,347,204 | A | 9/1994 | Gregory et al. |
| 5,021,186 | A | 6/1991 | Ota et al. | 5,355,079 | A | 10/1994 | Evans et al. |
| 5,030,907 | A | 7/1991 | Yih et al. | 5,357,211 | A | 10/1994 | Bryson et al. |
| 5,041,782 | A | 8/1991 | Marzan | 5,360,312 | A | 11/1994 | Mozingo |
| 5,045,781 | A | 9/1991 | Gleason et al. | 5,361,049 | A | 11/1994 | Rubin et al. |
| 5,059,898 | A | 10/1991 | Barsotti et al. | 5,363,050 | A | 11/1994 | Guo et al. |
| 5,061,192 | A | 10/1991 | Chapin et al. | 5,367,165 | A | 11/1994 | Toda et al. |
| 5,061,823 | A | 10/1991 | Carroll | 5,369,368 | A | 11/1994 | Kassen et al. |
| 5,062,628 | A | 11/1991 | Heyn et al. | 5,371,654 | A | 12/1994 | Beaman et al. |
| 5,066,357 | A | 11/1991 | Smyth, Jr. et al. | 5,373,231 | A | 12/1994 | Boll et al. |
| 5,082,627 | A | 1/1992 | Stanbro | 5,374,938 | A | 12/1994 | Hatazawa et al. |
| 5,084,671 | A | 1/1992 | Miyata et al. | 5,376,790 | A | 12/1994 | Linker et al. |
| 5,089,774 | A | 2/1992 | Nakano | 5,383,787 | A | 1/1995 | Switky et al. |
| 5,091,692 | A | 2/1992 | Ohno et al. | 5,389,885 | A | 2/1995 | Swart |
| 5,091,732 | A | 2/1992 | Mileski et al. | 5,395,253 | A | 3/1995 | Crumly |
| 5,095,891 | A | 3/1992 | Reitter | 5,397,855 | A | 3/1995 | Ferlier |
| 5,097,101 | A | 3/1992 | Trobough | 5,404,111 | A | 4/1995 | Mori et al. |
| 5,097,207 | A | 3/1992 | Blanz | 5,408,188 | A | 4/1995 | Katoh |
| 5,101,453 | A | 3/1992 | Rumbaugh | 5,408,189 | A | 4/1995 | Swart et al. |
| 5,107,076 | A | 4/1992 | Bullock et al. | 5,412,330 | A | 5/1995 | Ravel et al. |
| 5,116,180 | A | 5/1992 | Fung et al. | 5,412,866 | A | 5/1995 | Woith et al. |
| 5,126,286 | A | 6/1992 | Chance | 5,414,565 | A | 5/1995 | Sullivan et al. |
| 5,126,696 | A | 6/1992 | Grote et al. | 5,422,574 | A | 6/1995 | Kister |
| 5,133,119 | A | 7/1992 | Afshari et al. | 5,430,813 | A | 7/1995 | Anderson et al. |

| | | | | | |
|---|---|---|---|---|---|
| 5,441,690 A | 8/1995 | Ayala-Esquilin et al. | 5,670,888 A | 9/1997 | Cheng |
| 5,451,884 A | 9/1995 | Sauerland | 5,672,816 A | 9/1997 | Park et al. |
| 5,453,404 A | 9/1995 | Leedy | 5,675,499 A | 10/1997 | Lee et al. |
| 5,457,398 A | 10/1995 | Schwindt et al. | 5,675,932 A | 10/1997 | Mauney |
| 5,463,324 A | 10/1995 | Wardwell et al. | 5,676,360 A | 10/1997 | Boucher et al. |
| 5,467,024 A | 11/1995 | Swapp | 5,678,210 A | 10/1997 | Hannah |
| 5,469,324 A | 11/1995 | Henderson et al. | 5,685,232 A | 11/1997 | Inoue |
| 5,475,316 A | 12/1995 | Hurley et al. | 5,686,317 A | 11/1997 | Akram et al. |
| 5,476,211 A | 12/1995 | Khandros | 5,686,960 A | 11/1997 | Sussman et al. |
| 5,477,011 A | 12/1995 | Singles et al. | 5,688,618 A | 11/1997 | Hulderman et al. |
| 5,478,748 A | 12/1995 | Akins, Jr. et al. | 5,700,844 A | 12/1997 | Hedrick et al. |
| 5,479,108 A | 12/1995 | Cheng | 5,704,355 A | 1/1998 | Bridges |
| 5,479,109 A | 12/1995 | Lau et al. | 5,715,819 A | 2/1998 | Svenson et al. |
| 5,481,196 A | 1/1996 | Nosov | 5,720,098 A | 2/1998 | Kister |
| 5,481,936 A | 1/1996 | Yanagisawa | 5,723,347 A | 3/1998 | Kirano et al. |
| 5,487,999 A | 1/1996 | Farnworth | 5,726,211 A | 3/1998 | Hedrick et al. |
| 5,488,954 A | 2/1996 | Sleva et al. | 5,728,091 A | 3/1998 | Payne et al. |
| 5,493,070 A | 2/1996 | Habu | 5,729,150 A | 3/1998 | Schwindt |
| 5,493,236 A | 2/1996 | Ishii et al. | 5,731,920 A | 3/1998 | Katsuragawa |
| 5,500,606 A | 3/1996 | Holmes | 5,742,174 A | 4/1998 | Kister et al. |
| 5,505,150 A | 4/1996 | James et al. | 5,744,971 A | 4/1998 | Chan et al. |
| 5,506,498 A | 4/1996 | Anderson et al. | 5,748,506 A | 5/1998 | Bockelman |
| 5,506,515 A | 4/1996 | Godshalk et al. | 5,751,153 A | 5/1998 | Bockelman |
| 5,507,652 A | 4/1996 | Wardwell | 5,751,252 A | 5/1998 | Phillips |
| 5,510,792 A | 4/1996 | Ono et al. | 5,756,021 A | 5/1998 | Bedrick et al. |
| 5,511,010 A | 4/1996 | Burns | 5,756,908 A | 5/1998 | Knollmeyer et al. |
| 5,512,835 A | 4/1996 | Rivera et al. | 5,764,070 A | 6/1998 | Pedder |
| 5,517,126 A | 5/1996 | Yamaguchi | 5,767,690 A | 6/1998 | Fujimoto |
| 5,521,518 A | 5/1996 | Higgins | 5,772,451 A | 6/1998 | Dozier, II et al. |
| 5,521,522 A | 5/1996 | Abe et al. | 5,773,780 A | 6/1998 | Eldridge et al. |
| 5,523,694 A | 6/1996 | Cole, Jr. | 5,777,485 A | 7/1998 | Tanaka et al. |
| 5,528,158 A | 6/1996 | Sinsheimer et al. | 5,785,538 A | 7/1998 | Beaman et al. |
| 5,530,372 A | 6/1996 | Lee et al. | 5,792,668 A | 8/1998 | Fuller et al. |
| 5,531,022 A | 7/1996 | Beaman et al. | 5,793,213 A | 8/1998 | Bockelman et al. |
| 5,532,608 A | 7/1996 | Behfar-Rad et al. | 5,794,133 A | 8/1998 | Kashima |
| 5,537,372 A | 7/1996 | Albrecht et al. | 5,803,607 A | 9/1998 | Jones et al. |
| 5,539,323 A | 7/1996 | Davis, Jr. | 5,804,607 A | 9/1998 | Hedrick et al. |
| 5,539,676 A | 7/1996 | Yamaguchi | 5,804,982 A | 9/1998 | Lo et al. |
| 5,550,481 A | 8/1996 | Holmes et al. | 5,804,983 A | 9/1998 | Nakajima et al. |
| 5,561,378 A | 10/1996 | Bockelman et al. | 5,805,846 A | 9/1998 | Nakajima et al. |
| 5,565,788 A | 10/1996 | Burr et al. | 5,806,181 A | 9/1998 | Khandros et al. |
| 5,565,881 A | 10/1996 | Phillips et al. | 5,807,107 A | 9/1998 | Bright et al. |
| 5,569,591 A | 10/1996 | Kell et al. | 5,810,607 A | 9/1998 | Shih et al. |
| 5,571,324 A | 11/1996 | Sago et al. | 5,811,751 A | 9/1998 | Leong et al. |
| 5,578,932 A | 11/1996 | Adamian | 5,811,982 A | 9/1998 | Beaman et al. |
| 5,583,445 A | 12/1996 | Mullen | 5,813,847 A | 9/1998 | Eroglu et al. |
| 5,584,120 A | 12/1996 | Roberts | 5,814,847 A | 9/1998 | Shihadeh et al. |
| 5,584,608 A | 12/1996 | Gillespie | 5,820,014 A | 10/1998 | Dozier, II et al. |
| 5,589,781 A | 12/1996 | Higgins et al. | 5,821,763 A | 10/1998 | Beaman et al. |
| 5,594,358 A | 1/1997 | Ishikawa et al. | 5,824,494 A | 10/1998 | Feldberg |
| 5,600,256 A | 2/1997 | Woith et al. | 5,829,128 A | 11/1998 | Eldridge et al. |
| 5,601,740 A | 2/1997 | Eldridge et al. | 5,829,437 A | 11/1998 | Bridges |
| 5,610,529 A | 3/1997 | Schwindt | 5,831,442 A | 11/1998 | Heigl |
| 5,611,008 A | 3/1997 | Yap | 5,832,601 A | 11/1998 | Eldridge et al. |
| 5,617,035 A | 4/1997 | Swapp | 5,833,601 A | 11/1998 | Swartz et al. |
| 5,621,333 A | 4/1997 | Long et al. | 5,838,160 A | 11/1998 | Beaman et al. |
| 5,621,400 A | 4/1997 | Corbi | 5,841,288 A | 11/1998 | Meaney et al. |
| 5,623,213 A | 4/1997 | Liu et al. | 5,841,342 A | 11/1998 | Hegmann et al. |
| 5,623,214 A | 4/1997 | Pasiecznik, Jr. | 5,846,708 A | 12/1998 | Hollis et al. |
| 5,627,473 A | 5/1997 | Takami | 5,847,569 A | 12/1998 | Ho et al. |
| 5,628,057 A | 5/1997 | Phillips et al. | 5,848,500 A | 12/1998 | Kirk |
| 5,629,838 A | 5/1997 | Knight et al. | 5,852,232 A | 12/1998 | Samsavar et al. |
| 5,631,571 A | 5/1997 | Spaziani et al. | 5,852,871 A | 12/1998 | Khandros |
| 5,633,780 A | 5/1997 | Cronin | 5,854,608 A | 12/1998 | Leisten |
| 5,635,846 A | 6/1997 | Beaman et al. | 5,864,946 A | 2/1999 | Eldridge et al. |
| 5,642,298 A | 6/1997 | Mallory et al. | 5,867,073 A | 2/1999 | Weinreb et al. |
| 5,644,248 A | 7/1997 | Fujimoto | 5,869,974 A | 2/1999 | Akram et al. |
| 5,653,939 A | 8/1997 | Hollis et al. | 5,874,361 A | 2/1999 | Collins et al. |
| 5,656,942 A | 8/1997 | Watts et al. | 5,876,082 A | 3/1999 | Kempf et al. |
| 5,659,421 A | 8/1997 | Rahmel et al. | 5,878,486 A | 3/1999 | Eldridge et al. |
| 5,666,063 A | 9/1997 | Abercrombie et al. | 5,879,289 A | 3/1999 | Yarush et al. |
| 5,669,316 A | 9/1997 | Faz et al. | 5,883,522 A | 3/1999 | O'Boyle |
| 5,670,322 A | 9/1997 | Eggers et al. | 5,883,523 A | 3/1999 | Ferland et al. |

| | | | | | | |
|---|---|---|---|---|---|---|
| 5,884,398 | A | 3/1999 | Eldridge et al. | 6,064,213 | A | 5/2000 | Khandros et al. |
| 5,888,075 | A | 3/1999 | Hasegawa et al. | 6,064,217 | A | 5/2000 | Smith |
| 5,889,410 | A * | 3/1999 | El-Kareh et al. ............ 324/769 | 6,064,218 | A | 5/2000 | Godfrey et al. |
| 5,892,539 | A | 4/1999 | Colvin | 6,066,911 | A | 5/2000 | Lindemann et al. |
| 5,896,038 | A | 4/1999 | Budnaitis et al. | 6,071,009 | A | 6/2000 | Clyne |
| 5,896,326 | A | 4/1999 | Hoffmann | 6,078,183 | A | 6/2000 | Cole, Jr. |
| 5,900,737 | A | 5/1999 | Graham et al. | 6,078,500 | A | 6/2000 | Beaman et al. |
| 5,900,738 | A | 5/1999 | Khandros et al. | 6,090,261 | A | 7/2000 | Mathieu |
| 5,903,143 | A | 5/1999 | Mochizuki et al. | 6,091,236 | A | 7/2000 | Piety et al. |
| 5,905,421 | A | 5/1999 | Oldfield | 6,091,255 | A | 7/2000 | Godfrey |
| 5,910,727 | A | 6/1999 | Fujihara et al. | 6,091,256 | A | 7/2000 | Long et al. |
| 5,912,046 | A | 6/1999 | Eldridge et al. | 6,096,561 | A | 8/2000 | Tayi |
| 5,914,613 | A | 6/1999 | Gleason et al. | 6,096,567 | A | 8/2000 | Kaplan et al. |
| 5,914,614 | A | 6/1999 | Beaman et al. | 6,100,815 | A | 8/2000 | Pailthorp |
| 5,916,689 | A | 6/1999 | Collins et al. | 6,104,201 | A | 8/2000 | Beaman et al. |
| 5,917,707 | A | 6/1999 | Khandros et al. | 6,104,206 | A | 8/2000 | Verkuil |
| 5,923,180 | A | 7/1999 | Botka et al. | 6,110,823 | A | 8/2000 | Eldridge et al. |
| 5,926,029 | A | 7/1999 | Ference et al. | 6,114,864 | A | 9/2000 | Soejima et al. |
| 5,926,951 | A | 7/1999 | Khandros et al. | 6,114,865 | A | 9/2000 | Lagowski et al. |
| 5,940,965 | A | 8/1999 | Uhling et al. | 6,118,287 | A | 9/2000 | Boll et al. |
| 5,944,093 | A | 8/1999 | Viswanath | 6,118,894 | A | 9/2000 | Schwartz et al. |
| 5,945,836 | A | 8/1999 | Sayre et al. | 6,121,836 | A | 9/2000 | Vallencourt |
| 5,949,383 | A | 9/1999 | Hayes et al. | 6,124,725 | A | 9/2000 | Sato |
| 5,949,579 | A | 9/1999 | Baker | 6,127,831 | A | 10/2000 | Khoury et al. |
| 5,959,461 | A | 9/1999 | Brown et al. | 6,130,536 | A | 10/2000 | Powell et al. |
| 5,963,364 | A | 10/1999 | Leong et al. | 6,137,302 | A | 10/2000 | Schwindt |
| 5,966,645 | A | 10/1999 | Davis | 6,144,212 | A | 11/2000 | Mizuta |
| 5,970,429 | A | 10/1999 | Martin | 6,147,502 | A | 11/2000 | Fryer et al. |
| 5,973,504 | A | 10/1999 | Chong | 6,147,851 | A | 11/2000 | Anderson |
| 5,974,662 | A | 11/1999 | Eldridge et al. | 6,150,186 | A | 11/2000 | Chen et al. |
| 5,977,783 | A | 11/1999 | Takayama et al. | 6,150,831 | A * | 11/2000 | Asai et al. .................. 324/765 |
| 5,977,813 | A * | 11/1999 | Boerstler .................... 327/378 | 6,160,407 | A | 12/2000 | Nikawa |
| 5,981,268 | A | 11/1999 | Kovacs et al. | 6,166,553 | A | 12/2000 | Sinsheimer |
| 5,982,166 | A | 11/1999 | Mautz | 6,166,607 | A * | 12/2000 | Schoellkopf .................. 331/57 |
| 5,983,493 | A | 11/1999 | Eldridge et al. | 6,168,974 | B1 | 1/2001 | Chang et al. |
| 5,993,611 | A | 11/1999 | Moroney, III et al. | 6,169,410 | B1 | 1/2001 | Grace et al. |
| 5,994,152 | A | 11/1999 | Khandros et al. | 6,172,337 | B1 | 1/2001 | Johnsgard et al. |
| 5,995,914 | A | 11/1999 | Cabot | 6,174,744 | B1 | 1/2001 | Watanabe et al. |
| 5,996,102 | A | 11/1999 | Haulin | 6,175,228 | B1 | 1/2001 | Zamborelli et al. |
| 5,998,228 | A | 12/1999 | Eldridge et al. | 6,181,144 | B1 | 1/2001 | Hembree et al. |
| 5,998,768 | A | 12/1999 | Hunter et al. | 6,181,149 | B1 | 1/2001 | Godfrey et al. |
| 5,998,864 | A | 12/1999 | Khandros et al. | 6,181,297 | B1 | 1/2001 | Leisten |
| 5,999,268 | A | 12/1999 | Yonezawa et al. | 6,181,416 | B1 | 1/2001 | Falk |
| 6,001,760 | A | 12/1999 | Katsuda et al. | 6,184,053 | B1 | 2/2001 | Eldridge et al. |
| 6,002,426 | A | 12/1999 | Back et al. | 6,184,587 | B1 | 2/2001 | Khandros et al. |
| 6,006,002 | A | 12/1999 | Motok et al. | 6,184,845 | B1 | 2/2001 | Leisten et al. |
| 6,013,586 | A | 1/2000 | McGhee et al. | 6,191,596 | B1 | 2/2001 | Abiko |
| 6,019,612 | A | 2/2000 | Hasegawa et al. | 6,194,720 | B1 | 2/2001 | Li et al. |
| 6,023,103 | A | 2/2000 | Chang et al. | 6,206,273 | B1 | 3/2001 | Beaman et al. |
| 6,028,435 | A | 2/2000 | Nikawa | 6,208,225 | B1 | 3/2001 | Miller |
| 6,029,344 | A | 2/2000 | Khandros et al. | RE37,130 | E | 4/2001 | Fiori, Jr. |
| 6,031,383 | A | 2/2000 | Streib et al. | 6,211,663 | B1 | 4/2001 | Moulthrop et al. |
| 6,032,356 | A | 3/2000 | Eldridge et al. | 6,211,837 | B1 | 4/2001 | Crouch et al. |
| 6,032,714 | A | 3/2000 | Fenton | 6,215,196 | B1 | 4/2001 | Eldridge et al. |
| 6,033,935 | A | 3/2000 | Dozier, II et al. | 6,215,295 | B1 | 4/2001 | Smith, III |
| 6,034,533 | A | 3/2000 | Tervo et al. | 6,215,670 | B1 | 4/2001 | Khandros |
| 6,037,785 | A | 3/2000 | Higgins | 6,218,910 | B1 | 4/2001 | Miller |
| 6,040,739 | A | 3/2000 | Wedeen et al. | 6,222,031 | B1 | 4/2001 | Wakabayashi et al. |
| 6,042,712 | A | 3/2000 | Mathieu | 6,222,970 | B1 | 4/2001 | Wach et al. |
| 6,043,563 | A | 3/2000 | Eldridge et al. | 6,229,327 | B1 | 5/2001 | Boll et al. |
| 6,046,599 | A | 4/2000 | Long et al. | 6,232,149 | B1 | 5/2001 | Dozier, II et al. |
| 6,049,216 | A | 4/2000 | Yang et al. | 6,232,787 | B1 | 5/2001 | Lo et al. |
| 6,049,976 | A | 4/2000 | Khandros | 6,232,788 | B1 | 5/2001 | Schwindt et al. |
| 6,050,829 | A | 4/2000 | Eldridge et al. | 6,232,789 | B1 | 5/2001 | Schwindt |
| 6,051,422 | A | 4/2000 | Kovacs et al. | 6,233,613 | B1 | 5/2001 | Walker et al. |
| 6,052,653 | A | 4/2000 | Mazur et al. | 6,236,223 | B1 | 5/2001 | Brady et al. |
| 6,054,651 | A | 4/2000 | Fogel et al. | 6,242,803 | B1 | 6/2001 | Khandros et al. |
| 6,054,869 | A | 4/2000 | Hutton et al. | 6,242,929 | B1 | 6/2001 | Mizuta |
| 6,059,982 | A | 5/2000 | Palagonia et al. | 6,245,692 | B1 | 6/2001 | Pearce et al. |
| 6,060,888 | A | 5/2000 | Blackham et al. | 6,246,247 | B1 | 6/2001 | Eldridge et al. |
| 6,060,892 | A | 5/2000 | Yamagata | 6,251,595 | B1 | 6/2001 | Gordon et al. |
| 6,061,589 | A | 5/2000 | Bridges et al. | 6,255,126 | B1 | 7/2001 | Mathieu et al. |
| 6,062,879 | A | 5/2000 | Beaman et al. | 6,256,882 | B1 | 7/2001 | Gleason et al. |

| | | |
|---|---|---|
| 6,257,564 B1 | 7/2001 | Avneri et al. |
| 6,265,950 B1 | 7/2001 | Schmidt et al. |
| 6,268,015 B1 | 7/2001 | Mathieu et al. |
| 6,268,016 B1 | 7/2001 | Bhatt et al. |
| 6,271,673 B1 | 8/2001 | Furuta et al. |
| 6,274,823 B1 | 8/2001 | Khandros et al. |
| 6,275,043 B1 | 8/2001 | Mühlberger et al. |
| 6,275,738 B1 | 8/2001 | Kasevich et al. |
| 6,278,051 B1 | 8/2001 | Peabody |
| 6,278,411 B1 | 8/2001 | Ohlsson et al. |
| 6,281,691 B1 | 8/2001 | Matsunaga et al. |
| 6,286,208 B1 | 9/2001 | Shih et al. |
| 6,292,760 B1 | 9/2001 | Burns |
| 6,295,729 B1 | 10/2001 | Beaman et al. |
| 6,300,775 B1 | 10/2001 | Peach et al. |
| 6,300,780 B1 | 10/2001 | Beaman et al. |
| 6,307,161 B1 | 10/2001 | Grube et al. |
| 6,307,363 B1 | 10/2001 | Anderson |
| 6,307,672 B1 | 10/2001 | DeNure |
| 6,310,483 B1 | 10/2001 | Taura et al. |
| 6,320,372 B1 | 11/2001 | Keller |
| 6,320,396 B1 | 11/2001 | Nikawa |
| 6,327,034 B1 | 12/2001 | Hoover et al. |
| 6,329,827 B1 | 12/2001 | Beaman et al. |
| 6,330,164 B1 | 12/2001 | Khandros et al. |
| 6,332,270 B2 | 12/2001 | Beaman et al. |
| 6,334,247 B1 | 1/2002 | Beaman et al. |
| 6,335,625 B1 | 1/2002 | Bryant et al. |
| 6,339,338 B1 | 1/2002 | Eldridge et al. |
| 6,340,568 B2 | 1/2002 | Hefti |
| 6,340,895 B1 | 1/2002 | Uher et al. |
| 6,351,885 B2 | 3/2002 | Suzuki et al. |
| 6,352,454 B1 | 3/2002 | Kim et al. |
| 6,359,456 B1 | 3/2002 | Hembree et al. |
| 6,362,792 B1 | 3/2002 | Sawamura et al. |
| 6,366,247 B1 | 4/2002 | Sawamura et al. |
| 6,369,776 B1 | 4/2002 | Leisten et al. |
| 6,376,258 B2 | 4/2002 | Hefti |
| 6,384,614 B1 | 5/2002 | Hager et al. |
| 6,384,615 B2 | 5/2002 | Schwindt |
| 6,388,455 B1 | 5/2002 | Kamieniecki et al. |
| 6,395,480 B1 | 5/2002 | Hefti |
| 6,396,296 B1 | 5/2002 | Tarter et al. |
| 6,396,298 B1 | 5/2002 | Young et al. |
| 6,400,168 B2 | 6/2002 | Matsunaga et al. |
| 6,404,213 B2 | 6/2002 | Noda |
| 6,407,542 B1 | 6/2002 | Conte |
| 6,407,562 B1 | 6/2002 | Whiteman |
| 6,409,724 B1 | 6/2002 | Penny et al. |
| 6,414,478 B1 | 7/2002 | Suzuki |
| 6,415,858 B1 | 7/2002 | Getchel et al. |
| 6,418,009 B1 | 7/2002 | Brunette |
| 6,420,722 B2 | 7/2002 | Moore et al. |
| 6,424,316 B1 | 7/2002 | Leisten |
| 6,429,029 B1 | 8/2002 | Eldridge et al. |
| 6,441,315 B1 | 8/2002 | Eldridge et al. |
| 6,442,831 B1 | 9/2002 | Khandros et al. |
| 6,447,339 B1 | 9/2002 | Reed et al. |
| 6,448,788 B1 | 9/2002 | Meaney et al. |
| 6,448,865 B1 | 9/2002 | Miller |
| 6,452,406 B1 | 9/2002 | Beaman et al. |
| 6,452,411 B1 | 9/2002 | Miller et al. |
| 6,456,099 B1 | 9/2002 | Eldridge et al. |
| 6,456,103 B1 | 9/2002 | Eldridge et al. |
| 6,459,343 B1 | 10/2002 | Miller |
| 6,459,739 B1 | 10/2002 | Vitenberg |
| 6,468,098 B1 | 10/2002 | Eldridge |
| 6,475,822 B2 | 11/2002 | Eldridge |
| 6,476,333 B1 | 11/2002 | Khandros et al. |
| 6,476,442 B1 | 11/2002 | Williams et al. |
| 6,476,630 B1 | 11/2002 | Whitten et al. |
| 6,479,308 B1 | 11/2002 | Eldridge |
| 6,480,013 B1 | 11/2002 | Nayler et al. |
| 6,480,978 B1 | 11/2002 | Roy et al. |
| 6,481,939 B1 | 11/2002 | Gillespie et al. |
| 6,482,013 B2 | 11/2002 | Eldridge et al. |
| 6,483,327 B1 | 11/2002 | Bruce et al. |
| 6,488,405 B1 | 12/2002 | Eppes et al. |
| 6,490,471 B2 | 12/2002 | Svenson et al. |
| 6,491,968 B1 | 12/2002 | Mathieu et al. |
| 6,496,024 B2 | 12/2002 | Schwindt |
| 6,499,121 B1 | 12/2002 | Roy et al. |
| 6,501,343 B2 | 12/2002 | Miller |
| 6,509,751 B1 | 1/2003 | Mathieu et al. |
| 6,512,482 B1 | 1/2003 | Nelson et al. |
| 6,520,778 B1 | 2/2003 | Eldridge et al. |
| 6,525,555 B1 | 2/2003 | Khandros et al. |
| 6,526,655 B2 | 3/2003 | Beaman et al. |
| 6,528,984 B2 | 3/2003 | Beaman et al. |
| 6,528,993 B1 | 3/2003 | Shin et al. |
| 6,529,031 B2 * | 3/2003 | Gerstmeier et al. ......... 324/769 |
| 6,529,844 B1 | 3/2003 | Kapetanic et al. |
| 6,534,856 B1 | 3/2003 | Dozier, II et al. |
| 6,538,214 B2 | 3/2003 | Khandros |
| 6,538,538 B2 | 3/2003 | Hreish et al. |
| 6,539,531 B2 | 3/2003 | Miller et al. |
| 6,548,311 B1 | 4/2003 | Knoll |
| 6,549,022 B1 | 4/2003 | Cole, Jr. et al. |
| 6,549,106 B2 | 4/2003 | Martin |
| 6,551,884 B2 | 4/2003 | Masuoka |
| 6,559,671 B2 | 5/2003 | Miller et al. |
| 6,566,079 B2 | 5/2003 | Hefti |
| 6,572,608 B1 | 6/2003 | Lee et al. |
| 6,573,702 B2 | 6/2003 | Marcuse et al. |
| 6,578,264 B1 | 6/2003 | Gleason et al. |
| 6,580,283 B1 | 6/2003 | Carbone et al. |
| 6,582,979 B2 | 6/2003 | Coccioli et al. |
| 6,587,327 B1 | 7/2003 | Devoe et al. |
| 6,597,187 B2 | 7/2003 | Eldridge et al. |
| 6,603,322 B1 | 8/2003 | Boll et al. |
| 6,603,323 B1 | 8/2003 | Miller et al. |
| 6,603,324 B2 | 8/2003 | Eldridge et al. |
| 6,605,941 B2 | 8/2003 | Abe |
| 6,605,951 B1 | 8/2003 | Cowan |
| 6,605,955 B1 | 8/2003 | Costello et al. |
| 6,606,014 B2 | 8/2003 | Miller |
| 6,606,575 B2 | 8/2003 | Miller |
| 6,608,494 B1 | 8/2003 | Bruce et al. |
| 6,611,417 B2 | 8/2003 | Chen |
| 6,615,485 B2 | 9/2003 | Eldridge et al. |
| 6,616,966 B2 | 9/2003 | Mathieu et al. |
| 6,617,862 B1 | 9/2003 | Bruce |
| 6,617,866 B1 | 9/2003 | Ickes |
| 6,621,082 B2 | 9/2003 | Morita et al. |
| 6,621,260 B2 | 9/2003 | Eldridge et al. |
| 6,622,103 B1 | 9/2003 | Miller |
| 6,624,648 B2 | 9/2003 | Eldridge et al. |
| 6,627,461 B2 | 9/2003 | Chapman et al. |
| 6,627,483 B2 | 9/2003 | Ondricek et al. |
| 6,627,980 B2 | 9/2003 | Eldridge |
| 6,628,503 B2 | 9/2003 | Sogard |
| 6,628,980 B2 | 9/2003 | Atalar et al. |
| 6,633,174 B1 | 10/2003 | Satya et al. |
| 6,636,182 B2 | 10/2003 | Mehltretter |
| 6,639,461 B1 | 10/2003 | Tam et al. |
| 6,640,415 B2 | 11/2003 | Eslamy et al. |
| 6,640,432 B1 | 11/2003 | Mathieu et al. |
| 6,642,625 B2 | 11/2003 | Dozier, II et al. |
| 6,643,597 B1 | 11/2003 | Dunsmore |
| 6,644,982 B1 | 11/2003 | Ondricek et al. |
| 6,646,520 B2 | 11/2003 | Miller |
| 6,653,903 B2 | 11/2003 | Leich et al. |
| 6,655,023 B1 | 12/2003 | Eldridge et al. |
| 6,657,455 B2 | 12/2003 | Eldridge et al. |
| 6,657,601 B2 | 12/2003 | McLean |
| 6,661,316 B2 | 12/2003 | Hreish et al. |

| | | |
|---|---|---|
| 6,664,628 B2 | 12/2003 | Khandros et al. |
| 6,669,489 B1 | 12/2003 | Dozier, II et al. |
| 6,672,875 B1 | 1/2004 | Mathieu et al. |
| 6,677,744 B1 | 1/2004 | Long |
| 6,678,850 B2 | 1/2004 | Roy et al. |
| 6,678,876 B2 | 1/2004 | Stevens et al. |
| 6,680,659 B2 | 1/2004 | Miller |
| 6,685,817 B1 | 2/2004 | Mathieu |
| 6,686,754 B2 | 2/2004 | Miller |
| 6,690,185 B1 | 2/2004 | Khandros et al. |
| 6,701,265 B2 | 3/2004 | Hill et al. |
| 6,701,612 B2 | 3/2004 | Khandros et al. |
| 6,707,548 B2 | 3/2004 | Kreimer et al. |
| 6,708,403 B2 | 3/2004 | Beaman et al. |
| 6,710,265 B2 | 3/2004 | Hill et al. |
| 6,710,798 B1 | 3/2004 | Hershel et al. |
| 6,713,374 B2 | 3/2004 | Eldridge et al. |
| 6,714,828 B2 | 3/2004 | Eldridge et al. |
| 6,717,426 B2 | 4/2004 | Iwasaki |
| 6,720,501 B1 | 4/2004 | Henson |
| 6,722,032 B2 | 4/2004 | Beaman et al. |
| 6,724,205 B1 | 4/2004 | Hayden et al. |
| 6,724,928 B1 | 4/2004 | Davis |
| 6,727,579 B1 | 4/2004 | Eldridge et al. |
| 6,727,580 B1 | 4/2004 | Eldridge et al. |
| 6,727,716 B1 | 4/2004 | Sharif |
| 6,729,019 B2 | 5/2004 | Grube et al. |
| 6,731,804 B1 | 5/2004 | Carrieri et al. |
| 6,734,687 B1 | 5/2004 | Ishitani et al. |
| 6,737,920 B2 | 5/2004 | Jen et al. |
| 6,741,085 B1 | 5/2004 | Khandros et al. |
| 6,741,092 B2 | 5/2004 | Eldridge et al. |
| 6,741,129 B1 | 5/2004 | Corsi et al. |
| 6,744,268 B2 | 6/2004 | Hollman |
| 6,753,679 B1 | 6/2004 | Kwong et al. |
| 6,753,699 B2 | 6/2004 | Stockstad |
| 6,759,311 B2 | 7/2004 | Eldridge et al. |
| 6,759,859 B2 | 7/2004 | Deng et al. |
| 6,764,869 B2 | 7/2004 | Eldridge et al. |
| 6,768,328 B2 | 7/2004 | Self et al. |
| 6,770,955 B1 | 8/2004 | Coccioli et al. |
| 6,771,806 B1 | 8/2004 | Satya et al. |
| 6,777,319 B2 | 8/2004 | Grube et al. |
| 6,778,140 B1 | 8/2004 | Yeh |
| 6,778,406 B2 | 8/2004 | Eldridge et al. |
| 6,780,001 B2 | 8/2004 | Eldridge et al. |
| 6,784,674 B2 | 8/2004 | Miller |
| 6,784,677 B2 | 8/2004 | Miller |
| 6,784,679 B2 | 8/2004 | Sweet et al. |
| 6,788,093 B2 | 9/2004 | Aitren et al. |
| 6,788,094 B2 | 9/2004 | Khandros et al. |
| 6,791,176 B2 | 9/2004 | Mathieu et al. |
| 6,794,888 B2 | 9/2004 | Kawaguchi et al. |
| 6,794,934 B2 | 9/2004 | Betti-Berutto et al. |
| 6,794,950 B2 | 9/2004 | Du Toit et al. |
| 6,798,225 B2 | 9/2004 | Miller |
| 6,798,226 B2 | 9/2004 | Altmann et al. |
| 6,806,724 B2 | 10/2004 | Hayden et al. |
| 6,806,836 B2 | 10/2004 | Ogawa et al. |
| 6,807,734 B2 | 10/2004 | Eldridge et al. |
| 6,809,533 B1 | 10/2004 | Anlage et al. |
| 6,811,406 B2 | 11/2004 | Grube |
| 6,812,691 B2 | 11/2004 | Miller |
| 6,812,718 B1 | 11/2004 | Chong et al. |
| 6,815,963 B2 | 11/2004 | Gleason et al. |
| 6,816,031 B1 | 11/2004 | Miller |
| 6,816,840 B1 | 11/2004 | Goodwin, III |
| 6,817,052 B2 | 11/2004 | Grube |
| 6,818,840 B2 | 11/2004 | Khandros |
| 6,822,463 B1 | 11/2004 | Jacobs |
| 6,822,529 B2 | 11/2004 | Miller |
| 6,825,052 B2 | 11/2004 | Eldridge et al. |
| 6,825,422 B2 | 11/2004 | Eldridge et al. |
| 6,827,584 B2 | 12/2004 | Mathieu et al. |
| 6,835,898 B2 | 12/2004 | Eldridge et al. |
| 6,836,962 B2 | 1/2005 | Khandros et al. |
| 6,838,885 B2 | 1/2005 | Kamitani |
| 6,838,893 B2 | 1/2005 | Khandros et al. |
| 6,839,964 B2 | 1/2005 | Henson |
| 6,845,491 B2 | 1/2005 | Miller et al. |
| 6,850,082 B2 | 2/2005 | Schwindt |
| 6,856,129 B2 | 2/2005 | Thomas et al. |
| 6,856,150 B2 | 2/2005 | Sporck et al. |
| 6,862,727 B2 | 3/2005 | Stevens |
| 6,864,105 B2 | 3/2005 | Grube et al. |
| 6,864,694 B2 | 3/2005 | McTigue |
| 6,870,381 B2 | 3/2005 | Grube |
| 6,882,239 B2 | 4/2005 | Miller |
| 6,882,546 B2 | 4/2005 | Miller |
| 6,887,723 B1 | 5/2005 | Ondricek et al. |
| 6,888,362 B2 | 5/2005 | Eldridge et al. |
| 6,891,385 B2 | 5/2005 | Miller |
| 6,900,646 B2 | 5/2005 | Kasukabe et al. |
| 6,900,647 B2 | 5/2005 | Yoshida et al. |
| 6,900,652 B2 | 5/2005 | Mazur |
| 6,900,653 B2 | 5/2005 | Yu et al. |
| 6,902,416 B2 | 6/2005 | Feldman |
| 6,902,941 B2 | 6/2005 | Sun |
| 6,903,563 B2 | 6/2005 | Yoshida et al. |
| 6,906,506 B1 | 6/2005 | Reano et al. |
| 6,906,539 B2 | 6/2005 | Wilson et al. |
| 6,906,542 B2 | 6/2005 | Sakagawa et al. |
| 6,906,543 B2 | 6/2005 | Lou et al. |
| 6,907,149 B2 | 6/2005 | Slater |
| 6,908,364 B2 | 6/2005 | Back et al. |
| 6,909,297 B2 | 6/2005 | Ji et al. |
| 6,909,300 B2 | 6/2005 | Lu et al. |
| 6,909,983 B2 | 6/2005 | Sutherland |
| 6,910,268 B2 | 6/2005 | Miller |
| 6,911,814 B2 | 6/2005 | Miller et al. |
| 6,911,826 B2 | 6/2005 | Plotnikov et al. |
| 6,911,834 B2 | 6/2005 | Mitchell et al. |
| 6,911,835 B2 | 6/2005 | Chraft et al. |
| 6,912,468 B2 | 6/2005 | Marin et al. |
| 6,913,468 B2 | 7/2005 | Dozier, II et al. |
| 6,914,244 B2 | 7/2005 | Alani |
| 6,914,427 B2 | 7/2005 | Gifford et al. |
| 6,914,430 B2 | 7/2005 | Hasegawa et al. |
| 6,914,580 B2 | 7/2005 | Leisten |
| 6,917,195 B2 | 7/2005 | Hollman |
| 6,917,210 B2 | 7/2005 | Miller |
| 6,917,211 B2 | 7/2005 | Yoshida et al. |
| 6,917,525 B2 | 7/2005 | Mok et al. |
| 6,919,732 B2 | 7/2005 | Yoshida et al. |
| 6,922,069 B2 | 7/2005 | Jun |
| 6,924,653 B2 | 8/2005 | Schaeffer et al. |
| 6,924,655 B2 | 8/2005 | Kirby |
| 6,927,078 B2 | 8/2005 | Saijyo et al. |
| 6,927,079 B1 | 8/2005 | Fyfield |
| 6,927,586 B2 | 8/2005 | Thiessen |
| 6,927,587 B2 | 8/2005 | Yoshioka |
| 6,927,598 B2 | 8/2005 | Lee et al. |
| 6,930,498 B2 | 8/2005 | Tervo et al. |
| 6,933,713 B2 | 8/2005 | Cannon |
| 6,933,717 B1 | 8/2005 | Dogaru et al. |
| 6,933,725 B2 | 8/2005 | Lim et al. |
| 6,933,736 B2 | 8/2005 | Kobayashi et al. |
| 6,933,737 B2 | 8/2005 | Sugawara |
| 6,937,020 B2 | 8/2005 | Munson et al. |
| 6,937,037 B2 | 8/2005 | Eldridge et al. |
| 6,937,040 B2 | 8/2005 | Maeda et al. |
| 6,937,042 B2 | 8/2005 | Yoshida et al. |
| 6,937,045 B2 | 8/2005 | Sinclair |
| 6,937,341 B1 | 8/2005 | Woollam et al. |
| 6,940,264 B2 | 9/2005 | Ryken, Jr. et al. |
| 6,940,283 B2 | 9/2005 | McQueeney |

| | | | | | | |
|---|---|---|---|---|---|---|
| 6,943,563 | B2 | 9/2005 | Martens | 2001/0044152 A1 | 11/2001 | Burnett |
| 6,943,571 | B2 | 9/2005 | Worledge | 2001/0045511 A1 | 11/2001 | Moore et al. |
| 6,943,574 | B2 | 9/2005 | Altmann et al. | 2001/0054906 A1 | 12/2001 | Fujimura |
| 6,944,380 | B1 | 9/2005 | Hideo et al. | 2002/0005728 A1 | 1/2002 | Babson et al. |
| 6,946,859 | B2 | 9/2005 | Karavakis et al. | 2002/0008533 A1 | 1/2002 | Ito et al. |
| 6,946,860 | B2 | 9/2005 | Cheng et al. | 2002/0009377 A1 | 1/2002 | Shafer |
| 6,948,391 | B2 | 9/2005 | Brassell et al. | 2002/0009378 A1 | 1/2002 | Obara |
| 6,948,981 | B2 | 9/2005 | Pade | 2002/0011859 A1 | 1/2002 | Smith et al. |
| 6,949,942 | B2 | 9/2005 | Eldridge et al. | 2002/0011863 A1 | 1/2002 | Takahashi et al. |
| 6,970,001 | B2 | 11/2005 | Chheda et al. | 2002/0050828 A1 | 5/2002 | Seward, IV et al. |
| 6,987,483 | B2 | 1/2006 | Tran | 2002/0070743 A1 | 6/2002 | Felici et al. |
| 7,001,785 | B1 | 2/2006 | Chen | 2002/0070745 A1 | 6/2002 | Johnson et al. |
| 7,002,133 | B2 | 2/2006 | Beausoleil et al. | 2002/0079911 A1 | 6/2002 | Schwindt |
| 7,002,363 | B2 | 2/2006 | Mathieu | 2002/0109088 A1 | 8/2002 | Nara et al. |
| 7,002,364 | B2 | 2/2006 | Kang et al. | 2002/0118034 A1 | 8/2002 | Laureanti |
| 7,003,184 | B2 | 2/2006 | Ronnekleiv et al. | 2002/0149377 A1 | 10/2002 | Hefti et al. |
| 7,005,842 | B2 | 2/2006 | Fink et al. | 2002/0153909 A1 | 10/2002 | Petersen et al. |
| 7,005,868 | B2 | 2/2006 | McTigue | 2002/0163769 A1 | 11/2002 | Brown |
| 7,005,879 | B1 | 2/2006 | Robertazzi | 2002/0168659 A1 | 11/2002 | Hefti et al. |
| 7,006,046 | B2 | 2/2006 | Aisenbrey | 2002/0176160 A1 | 11/2002 | Suzuki et al. |
| 7,007,380 | B2 | 3/2006 | Das et al. | 2002/0180466 A1 | 12/2002 | Hiramatsu et al. |
| 7,009,188 | B2 | 3/2006 | Wang | 2002/0197709 A1 | 12/2002 | Van der Weide et al. |
| 7,009,383 | B2 | 3/2006 | Harwood et al. | 2003/0010877 A1 | 1/2003 | Landreville et al. |
| 7,009,415 | B2 | 3/2006 | Kobayashi et al. | 2003/0030822 A1 | 2/2003 | Finarov |
| 7,011,531 | B2 | 3/2006 | Egitto et al. | 2003/0032000 A1 | 2/2003 | Liu et al. |
| 7,012,425 | B2 | 3/2006 | Shoji | 2003/0040004 A1 | 2/2003 | Hefti et al. |
| 7,012,441 | B2 | 3/2006 | Chou et al. | 2003/0057513 A1 | 3/2003 | Leedy |
| 7,013,221 | B1 | 3/2006 | Friend et al. | 2003/0062915 A1 | 4/2003 | Arnold et al. |
| 7,014,499 | B2 | 3/2006 | Yoon | 2003/0072549 A1 | 4/2003 | Facer et al. |
| 7,015,455 | B2 | 3/2006 | Mitsuoka et al. | 2003/0076585 A1 | 4/2003 | Ledley |
| 7,015,689 | B2 | 3/2006 | Kasajima et al. | 2003/0077649 A1 | 4/2003 | Cho et al. |
| 7,015,690 | B2 | 3/2006 | Wang et al. | 2003/0088180 A1 | 5/2003 | Van Veen et al. |
| 7,015,703 | B2 | 3/2006 | Hopkins et al. | 2003/0119057 A1 | 6/2003 | Gascoyne et al. |
| 7,015,707 | B2 | 3/2006 | Cherian | 2003/0139662 A1 | 7/2003 | Seidman |
| 7,015,708 | B2 | 3/2006 | Beckous et al. | 2003/0139790 A1 | 7/2003 | Ingle et al. |
| 7,015,709 | B2 | 3/2006 | Capps et al. | 2003/0155939 A1 | 8/2003 | Lutz et al. |
| 7,015,710 | B2 | 3/2006 | Yoshida et al. | 2003/0170898 A1 | 9/2003 | Gunderson et al. |
| 7,015,711 | B2 | 3/2006 | Rothaug et al. | 2003/0184332 A1 | 10/2003 | Tomimatsu et al. |
| 7,019,541 | B2 | 3/2006 | Kittrell | 2003/0215966 A1 | 11/2003 | Rolda et al. |
| 7,019,544 | B1 | 3/2006 | Jacobs et al. | 2004/0015060 A1 | 1/2004 | Samsoondar et al. |
| 7,019,701 | B2 | 3/2006 | Ohno et al. | 2004/0021475 A1 | 2/2004 | Ito et al. |
| 7,020,360 | B2 | 3/2006 | Satomura et al. | 2004/0061514 A1 | 4/2004 | Schwindt et al. |
| 7,020,363 | B2 | 3/2006 | Johannessen | 2004/0066181 A1 | 4/2004 | Theis |
| 7,022,976 | B1 | 4/2006 | Santana, Jr. et al. | 2004/0069776 A1 | 4/2004 | Fagrell et al. |
| 7,022,985 | B2 | 4/2006 | Knebel et al. | 2004/0090223 A1 | 5/2004 | Yonezawa |
| 7,023,225 | B2 | 4/2006 | Blackwood | 2004/0095145 A1 | 5/2004 | Boudiaf et al. |
| 7,023,226 | B2 | 4/2006 | Okumura et al. | 2004/0095641 A1 | 5/2004 | Russum et al. |
| 7,023,231 | B2 | 4/2006 | Howland, Jr. et al. | 2004/0100276 A1 | 5/2004 | Fanton |
| 7,025,628 | B2 | 4/2006 | LaMeres et al. | 2004/0100297 A1 | 5/2004 | Tanioka et al. |
| 7,026,832 | B2 | 4/2006 | Chaya et al. | 2004/0108847 A1 | 6/2004 | Stoll et al. |
| 7,026,833 | B2 | 4/2006 | Rincon et al. | 2004/0113640 A1 | 6/2004 | Cooper et al. |
| 7,026,834 | B2 | 4/2006 | Hwang | 2004/0130787 A1 | 7/2004 | Thome-Forster et al. |
| 7,026,835 | B2 | 4/2006 | Farnworth et al. | 2004/0132222 A1 | 7/2004 | Hembree et al. |
| 7,030,599 | B2 | 4/2006 | Douglas | 2004/0134899 A1 | 7/2004 | Hiramatsu et al. |
| 7,030,827 | B2 | 4/2006 | Mahler et al. | 2004/0140819 A1 | 7/2004 | McTigue et al. |
| 7,032,307 | B2 | 4/2006 | Matsunaga et al. | 2004/0147034 A1 | 7/2004 | Gore et al. |
| 7,034,553 | B2 | 4/2006 | Gilboe | 2004/0162689 A1 | 8/2004 | Jamneala et al. |
| 7,035,738 | B2 | 4/2006 | Matsumoto et al. | 2004/0170312 A1 | 9/2004 | Soenksen |
| 7,071,722 | B2 | 7/2006 | Yamada et al. | 2004/0175294 A1 | 9/2004 | Ellison et al. |
| 7,088,981 | B2 | 8/2006 | Chang | 2004/0186382 A1 | 9/2004 | Modell et al. |
| 7,096,133 | B1 | 8/2006 | Martin et al. | 2004/0193382 A1 | 9/2004 | Adamian et al. |
| 7,161,363 | B2 | 1/2007 | Gleason et al. | 2004/0197771 A1 | 10/2004 | Powers et al. |
| 7,187,188 | B2 | 3/2007 | Andrews et al. | 2004/0199350 A1 | 10/2004 | Blackham et al. |
| 7,188,037 | B2 | 3/2007 | Hidehira | 2004/0201388 A1 | 10/2004 | Barr |
| 7,271,603 | B2 | 9/2007 | Gleason et al. | 2004/0207072 A1 | 10/2004 | Hiramatsu et al. |
| 2001/0002794 | A1 | 6/2001 | Draving et al. | 2004/0207424 A1 | 10/2004 | Hollman |
| 2001/0009061 | A1 | 7/2001 | Gleason et al. | 2004/0239338 A1 | 12/2004 | Johnsson et al. |
| 2001/0009377 | A1 | 7/2001 | Schwindt et al. | 2004/0246004 A1 | 12/2004 | Heuermann |
| 2001/0010468 | A1 | 8/2001 | Gleason et al. | 2004/0251922 A1 | 12/2004 | Martens et al. |
| 2001/0020283 | A1 | 9/2001 | Sakaguchi | 2005/0024069 A1 | 2/2005 | Hayden et al. |
| 2001/0024116 | A1 | 9/2001 | Draving | 2005/0026276 A1 | 2/2005 | Chou |
| 2001/0030549 | A1 | 10/2001 | Gleason et al. | 2005/0030047 A1 | 2/2005 | Adamian |
| 2001/0043073 | A1 | 11/2001 | Montoya | 2005/0054029 A1 | 3/2005 | Tomimatsu et al. |

| | | | |
|---|---|---|---|
| 2005/0062533 A1 | 3/2005 | Vice | |
| 2005/0068054 A1 | 3/2005 | Mok et al. | |
| 2005/0083130 A1 | 4/2005 | Grilo | |
| 2005/0088191 A1 | 4/2005 | Lesher | |
| 2005/0101846 A1 | 5/2005 | Fine et al. | |
| 2005/0116730 A1 | 6/2005 | Hsu | |
| 2005/0142033 A1 | 6/2005 | Glezer et al. | |
| 2005/0151548 A1 | 7/2005 | Hayden et al. | |
| 2005/0156675 A1 | 7/2005 | Rohde et al. | |
| 2005/0164160 A1 | 7/2005 | Gunter et al. | |
| 2005/0165316 A1 | 7/2005 | Lowery et al. | |
| 2005/0168722 A1 | 8/2005 | Forstner et al. | |
| 2005/0174191 A1 | 8/2005 | Brunker et al. | |
| 2005/0178980 A1 | 8/2005 | Skidmore et al. | |
| 2005/0184742 A1* | 8/2005 | Huang et al. ............. 324/754 | |
| 2005/0195124 A1 | 9/2005 | Puente Baliarda et al. | |
| 2005/0229053 A1 | 10/2005 | Sunter | |
| 2005/0236587 A1 | 10/2005 | Kodama et al. | |
| 2005/0237102 A1 | 10/2005 | Tanaka | |
| 2006/0030060 A1 | 2/2006 | Noguchi et al. | |
| 2006/0052075 A1 | 3/2006 | Galivanche et al. | |
| 2006/0155270 A1 | 7/2006 | Hancock et al. | |
| 2006/0184041 A1 | 8/2006 | Andrews et al. | |
| 2006/0226864 A1 | 10/2006 | Kramer | |
| 2007/0024506 A1 | 2/2007 | Hardacker | |
| 2007/0030021 A1 | 2/2007 | Cowan et al. | |

FOREIGN PATENT DOCUMENTS

| | | |
|---|---|---|
| CN | 1083975 | 3/1994 |
| DE | 2951072 | 7/1981 |
| DE | 3426565 | 1/1986 |
| DE | 3637549 | 5/1988 |
| DE | 288234 | 3/1991 |
| DE | 4223658 | 1/1993 |
| DE | 9313420 | 10/1993 |
| DE | 19522774 | 1/1997 |
| DE | 19542955 | 5/1997 |
| DE | 19618717 | 1/1998 |
| DE | 19749687 | 5/1998 |
| DE | 29809568 | 10/1998 |
| DE | 10000324 | 7/2001 |
| DE | 20220754 | 5/2004 |
| EP | 0230766 | 12/1985 |
| EP | 0195520 | 9/1986 |
| EP | 0230348 | 7/1987 |
| EP | 0259163 | 3/1988 |
| EP | 0259183 | 3/1988 |
| EP | 0259942 | 3/1988 |
| EP | 0261986 | 3/1988 |
| EP | 0270422 | 6/1988 |
| EP | 0333521 | 9/1989 |
| EP | 0460911 | 12/1991 |
| EP | 0846476 | 6/1998 |
| EP | 0 945 736 | 9/1999 |
| EP | 0945736 | 9/1999 |
| GB | 579665 | 8/1946 |
| GB | 2014315 | 8/1979 |
| GB | 2179458 | 3/1987 |
| JP | 52-19046 | 2/1977 |
| JP | 53-037077 | 4/1978 |
| JP | 53037077 | 4/1978 |
| JP | 53-052354 | 5/1978 |
| JP | 55-115383 | 9/1980 |
| JP | 55115383 | 9/1980 |
| JP | 56-007439 | 1/1981 |
| JP | 56-88333 | 7/1981 |
| JP | 5691503 | 7/1981 |
| JP | 56088333 | 7/1981 |
| JP | 57-075480 | 5/1982 |
| JP | 57075480 | 5/1982 |
| JP | 57-163035 | 10/1982 |
| JP | 57163035 | 10/1982 |
| JP | 57171805 | 10/1982 |
| JP | 58-130602 | 8/1983 |
| JP | 594189 U | 1/1984 |
| JP | 60-5462 | 4/1984 |
| JP | 60-236241 | 11/1985 |
| JP | 61142802 | 6/1986 |
| JP | 62-11243 | 1/1987 |
| JP | 62-51235 | 3/1987 |
| JP | 62-098634 | 5/1987 |
| JP | 62-107937 | 5/1987 |
| JP | 62098634 | 5/1987 |
| JP | 62107937 | 5/1987 |
| JP | 62-179126 | 8/1987 |
| JP | 62-239050 | 10/1987 |
| JP | 62239050 | 10/1987 |
| JP | 62295374 | 12/1987 |
| JP | 63-108736 | 5/1988 |
| JP | 63-129640 | 6/1988 |
| JP | 63-143814 | 6/1988 |
| JP | 63-152141 | 6/1988 |
| JP | 63-192246 | 8/1988 |
| JP | 63-318745 | 12/1988 |
| JP | 64-21309 | 2/1989 |
| JP | 1-165968 | 6/1989 |
| JP | 1-214038 | 8/1989 |
| JP | 01209380 | 8/1989 |
| JP | 1-219575 | 9/1989 |
| JP | 1-296167 | 11/1989 |
| JP | 2-22836 | 1/1990 |
| JP | 2-124469 | 5/1990 |
| JP | 2-141681 | 5/1990 |
| JP | 02124469 | 5/1990 |
| JP | 02135804 | 5/1990 |
| JP | 2-191352 | 7/1990 |
| JP | 3-175367 | 7/1991 |
| JP | 3-196206 | 8/1991 |
| JP | 3196206 | 8/1991 |
| JP | 3-228348 | 10/1991 |
| JP | 03228348 | 10/1991 |
| JP | 4-130639 | 5/1992 |
| JP | 04130639 | 5/1992 |
| JP | 4-159043 | 6/1992 |
| JP | 04159043 | 6/1992 |
| JP | 4-206930 | 7/1992 |
| JP | 04206930 | 7/1992 |
| JP | 4-340248 | 11/1992 |
| JP | 5-082631 | 4/1993 |
| JP | 05082631 | 4/1993 |
| JP | 5-113451 | 5/1993 |
| JP | 51-57790 | 6/1993 |
| JP | 5157790 | 6/1993 |
| JP | 51-66893 | 7/1993 |
| JP | 5166893 | 7/1993 |
| JP | 6-85044 | 3/1994 |
| JP | 60-71425 | 3/1994 |
| JP | 6-102313 | 4/1994 |
| JP | 6-132709 | 5/1994 |
| JP | 6154238 | 6/1994 |
| JP | 6-295949 | 10/1994 |
| JP | 7-005078 | 1/1995 |
| JP | 7-12871 | 1/1995 |
| JP | 7005078 | 1/1995 |
| JP | 7012871 | 1/1995 |
| JP | 8-35987 | 2/1996 |
| JP | 8035987 | 2/1996 |
| JP | 8-261898 | 10/1996 |
| JP | 8-330401 | 12/1996 |
| JP | 08330401 | 12/1996 |
| JP | 09127432 | 5/1997 |
| JP | 10-48256 | 2/1998 |
| JP | 10-116866 | 5/1998 |
| JP | 10116866 | 5/1998 |
| JP | 11-023975 | 1/1999 |

| | | |
|---|---|---|
| JP | 11004001 | 1/1999 |
| JP | 11023975 | 1/1999 |
| JP | 2000-329664 | 11/2000 |
| JP | 2001-124676 | 5/2001 |
| JP | 2001-189285 | 7/2001 |
| JP | 2001-189378 | 7/2001 |
| JP | 2002-203879 | 7/2002 |
| JP | 2002-243502 | 8/2002 |
| JP | 2002243502 | 8/2002 |
| JP | 2004-507851 | 3/2004 |
| KR | 2003/0090158 | 11/2003 |
| SU | 843040 | 6/1981 |
| SU | 1195402 | 11/1985 |
| SU | 1327023 | 7/1987 |
| SU | 1392603 | 4/1988 |
| WO | WO80/00101 | 1/1980 |
| WO | WO94/10554 | 5/1994 |
| WO | WO98/07040 | 2/1998 |
| WO | WO 00/73905 | 12/2000 |
| WO | WO01/07207 | 2/2001 |
| WO | WO 01/69656 | 9/2001 |
| WO | WO 2004/044604 | 5/2004 |
| WO | WO 2004/065944 | 8/2004 |
| WO | WO 2004/079299 | 9/2004 |
| WO | WO 2005/062025 | 7/2005 |
| WO | WO 2007/145727 | 12/2007 |
| WO | WO 2007/145728 | 12/2007 |

OTHER PUBLICATIONS

Cohn, Seymour B., "Optimum Design of Stepped Transmission-Line Transformers," I.R.E. Transactions—Microwave Theory and Techniques, No. 3, 1955, pp. 16-21.

Hopper, Samuel, "The Design of Ridged Waveguides," I.R.E. Transactions—Microwave Theory and techniques, No. 5, Oct. 1955, pp. 20-29.

Chen, Tsung-Shan, "Calculation of Parameters of Ridge Waveguides," IRE Transactions on Microwave Theory and Techniques, Jan. 1957, pp. 12-17.

IRE 20.1, Committee Personnel, "IRE Standards on Methods of Measuring Noise in Linear Twoports, 1959," Proc. IRE, vol. 48, pp. 60-68, Jan. 1960, pp. 32-40.

Fukui, H., "Available Power Gain, Noise Figure, and Noise Measure of Two-Ports and Their Graphical Representations," pp. 18-23, Reprinted from IEEE Trans. Circuit Theory, vol. CT-13, pp. 137-142, Jun. 1966.

Beaubien, M.J., et al., "An Accurate Finite-Difference Method for Higher Order Waveguide Modes," IEEE Transactions on Microwave Theory and Techniques, vol. M11-16, No. 12, Dec. 1968, pp. 1007-1017.

Lane, Richard Q., "The Determination of Device Noise Parameters," Proc. IEEE, vol. 57, Aug. 1969, pp. 1461-1462.

Adamian, Vaheh, et al., "A Novel Procedure for Receiver Noise Characterization," IEEE Transactions on Instrumentaton and Measurement, Jun. 1973.

Daly, P., "Polar Geometry Waveguides by finite-element Methods," IEEE Transactions on Microwave Theory and Technique, vol. MTT-22, No. 3, Mar. 1974, pp. 202-209.

Fink, Donald G., et al., "Electronics Engineers' Handbook," Sec. 17-52 Measurement and Control Circuits, 1975, pp. 17-22-17-27.

Bry, A., et al, "Bypass Capacitor for Chip Probe," IBM Technical Disclosure Bulletin, vol. 18, No. 11, Apr. 1976.

Skobern, J.R., "Subminiature High-Frequency Probe," IBM Technical disclosure Bulletin, vol. 19,No. 10, Mar. 1977.

Berg, William, et al., "Elastomers solve tough problems in high-frequency systems," 2119 EDN vol. 23, Jan. 5, 1978, pp. 36-42.

Eisenhart, R.L., "A Better Microstrip Connector," 1978 IEEE MTT-S International Microwave Symposium Digest, Jun. 27-29, Ottawa, Canada.

Gommlich, Hans, et al., "Verzerrungsmessungen-Wichtige Aufgabe in der Ubertragungstechnik," Elektronik 8/ Apr. 23, 1982, pp. 110-119.

Larock, V., et al., "Automatic Noise Temperature Measurement Through Frequency Variation," IEEE Transactions on Microwave Theory and Techniques, vol. MTT-30, No. 8, Aug. 1982, pp. 1286-1288.

Maury Microwave Corp., "Transistor Test Fixture (TTF) Inserts, Calibration & Check Devices, MT951, MT952, MT953 Series," Advanced Data 4T-002, Sep. 20, 1982, pp. 1-2.

Maury Microwave Corp., "Transistor Test Fixture (TTF)," MT950 Series, Sep. 20, 1982, 2 pages.

Maury Microwave Corp., "Transistor Test Fixture (TTF)," MT950 Series, Advanced data 4T-001, Oct. 7, 1982.

Abbott, D.A., et al., "Automatic noise figure measurements with computer control and correction," 8054 Radio and Electronic Engineer vol. 52, Oct. 1982, pp. 468-474.

Swain, Howard L. et al., "Noise Figure Meter Sets Records for Accuracy, Repeatability, and Convenience," 1266 Hewlett-Packard Journal, vol. 34, No. 4, Apr. 1983, pp. 23-34.

Adamian, V. et al., "Simplified Noise Evaluation of Microwave Receiver," IEEE Transactions on Instrumentation and Measurement, vol. IM-33, No. 2, Jun. 1984, 136-140.

Pastori, William E., "High accuracy microwave noise figure measurements," 8029 Electronic Engineering 56, No. 1984, pp. 181-189.

Inter-Continental Microwave, "Product Catalog," VMC 1055 Jan. 1986.

Design Technique, "Microstrip Microwave Test Fixture," May 1986.

Cascade Microtech, Inc., "Wide Probe Assembly," Full Scale Drawing, May 29, 1986, 2 pages.

Jackson, Robert et al., "Surface-to-Surface Transition via Electromagnetic Coupling of Coplanar Waveguides," Nov. 1987, 8099 IEEE Transactions on Microwave Theory and Techniques MTT-35, pp. 1027-1032.

Sharma, A., "Tunable Waveguide-to-Microstrip Transition for Millimeter-Wave Applications," IEE MTT-S Digest 1987, pp. 353-356.

Izadian, Jamal S., "Unified Design Plans Aid Waveguide Transitions," Microwaves & R&F, May 1987, pp. 213-222.

Mazilu, T., "A Self-Adjusting Waveguide-to-Microstrip Transition," Microwave Journal, Jul. 1987, pp. 133-134.

Carlton, D.E. et al., "Accurate Measurement of High-speed Package and Interconnect Parasitics," IEEE 1988 Custom Integrated Circuits Conference, pp. 23.3.1-23.3.6.

Fraser, Artur, et al., "GHz On-Silicon-Wafer Probing Calibration Methods," Paper 7.6, IEEE 1988 Bipolar Circuits & Technology Meeting, pp. 154-157.

Modolo, John A., et al, "Wafer level high-frequency measurements of photodetector characteristics," Applied Optics, vol. 27 pp. 3059-3061, Aug. 1988.

Design Technique, "Adjustable Test Fixture," 1988.

Tong, Peter R., et al., "Noise Measurements at MM-Wave Frequencies," 176 Microwave Journal 31, Jul. 1988.

Barsotti, C., et al., "New Probe Cards Replace Needle Types," Semiconductor International, Aug. 1988, pp. 98-101.

Microwave Journal, "Microwave Products," Sep. 1988, pp. 297.

Cascade Microtech Microprobe Update, "Spurious propagation, modes removed by probe absorber," Apr. 1989.

Esteban, J., et al., "Mode Spectrum of Waveguides Using A Transverse S-Matrix Resonance Method," AP-S International Symposium 1989, IEEE Catalog No. CH-2654-2189, San Jose, CA, Jun. 26-30, 1989, pp. 1263-1267.

Ponchak, George, et al., "A New Rectangular Waveguide to Coplaner Waveguide Transition," Prepared for 1990 IEEE MTT-S International Microwave Symposium to be held between May 8-10, 1990 in Dallas, Texas, Jan. 1990.

Dalman, G.C., "New Waveguide-to-Coplaner Waveguide Transition for Centimetre and Millimetre Wave Applications," Electronics Letters, Jun. 21, 1990, vol. 26, No. 13.

Cascade Microtech WPH-700 series, "Multicontact High-Speed Integrated Circuit," 1991, 700S-591.

Liu, S.M. Joseph, et al., "A New Probe for W-band On-wafer Measurements," IEEE MTT-S Digest, 1993, pp. 1335-1338.

Photo of Micromanipulator Probe Station, 1994.

Maury Microwave Corp., Transistor Test Fixture (TTF) MT950 Series, May 31, 1995, Advanced Data, 4T-0011.

Cascade Microtech, "Layout rules for WPH-900 Series probes," Applications Note, 1996.
Cascade Microtech, "Air coplanar Probe Series," 1997.
Yong-Dae, Kim, et al. "Fabrication of silicon Micro-Probe for Vertical Probe Card Application," Jpn. J. Appl. Phys. vol. 37, Part 1, No. 12B, Dec. 1998, pp. 7070-7073.
"A Broadband Microwave choke," Microwave Journal, Dec. 1999.
"The Air Coplanar Probe offers a highly compliant, rugged probe with lowest insertion loss available," Cascade Microtech, Inc., Air coplanar Probe Series, 2000.
Cascade Microtech, "On-Wafer Test Solutions for State-of-the-Art Electro-Optical Components," 2001.
Purroy. F. et al., "New Theoretical Analysis of the LRRm Calibration Technique for Vector Network Analyzers," IEEE Transactions on Instrumentation and Measurement, vol. 50, No. 5, Oct. 2001, pp. 1307-1313.
"Laser Diode Test Solution," Oct. 9, 2002, http:/www.cascademicrotech.com/index.cfm/fuseaction/pg.view/pID/136.
Liang, Qingqing, et al., "Accurate ac Transistor Characterization to 110 GHz Using a New Four-port Self-Calibrated Extraction Technique," 2004 Topical Meeting on Silicon Monolitic Integrated Circuits in RF Systems, pp. 282-285.
Basu, S., et al, "A Membrane Quandrant Probe for R&D Applications," Cascade Microtech, Inc. At least one year prior to filing.
Electrical Operation, Calibration and Measurement Steps with the HP 8510, At least one year prior to filing.
Whinnery, J.R. et al., "Equivalent Circuits for Discontinuities in Transmission Lines," Proceedings of IRE, at least one year prior to filing.
Inter-Continental Microwave, Application Note: 101, Microwave Semiconductor Chip Measurements using the HP 8510B TRL-Calibration Technique, at least one year prior to filing.
Cascade Microtech, "Special Purpose Probe 40/80 Gb/s High Performance Quandrant," at least one year prior to filing.
Agilent Technology Product Information, HPW281D Waveguide Adapter, 1 mm (m) to W-Band, 75 GHz to 110 GHz.
Cascade Microwave, "Introducing the World's First Microwave Wafer Probing Equipment," 4 pages, 1983.
Malm, R.L. "Reduction of Stray Fields About SEM Samples," IBM Technical Disclosure Bulletin, vol. 21, No. 7, Dec. 1978 2 pages.
Kuhn, Nick, "Accurate and Automatic Noise Figure Measurements with Standard Equipment," Hewlett-Packard co., Inc., Stanford Park Division 1501 Page Mill Road, Palo Alto, CA 94304, 3 pages Conference: Technology Grow for the 80's. 1980 IEEE MTT-S International Microwave Symposium Digest, Washington, DC, May 28-30, 1980.
International Search Report for PCT/US06/16238 mailed Feb. 28, 2007.
Written Opinion of the International Searching Authority for PCT/US06/16238, mailed Feb. 28, 2007.
Partial International Search Report for PCT/US2005/039561, mailed Mar. 21, 2006.
International Search Report for PCT/US2005/039561, mailed May 18, 2006.
Written Opinion of the International Searching Authority for PCT/US2005/039561, mailed May 18, 2006.
Mark S. Boguski and Martin W. McIntosh, "Biomedical informatics for proteomics," insight: review article, Nature 422, 233-237 (2003); doi:10.1038/nature01515.
Daniel Vanderweide, "THz Frequency Science & Technology Biomolecular Interaction Sensing with Sub-Terahertz Fields," University of Wisconsin-Madison, 2 pages, date unknown.
L.L. Sohn, O.A.Saleh, G.R. Facer, A.J. Beavis, R.S. Allan, and D.A. Notterman, "Capacitance cytometry: Measuring biological cells one by one," PNAS Sep. 26, 2000, vol. 97 No. 20 pp. 10687-10690, www.pnas.org.
Sam Hanash, "insight review articles, Disease proteomics," Nature, vol. 422, Mar. 13, 2003, pp. 226-232.
Mike Tyers and Matthias Mann, "insight overview, From genomics to proteomics," Nature, vol. 422, Mar. 13, 2003, pp. 193-197.
Andrej Sali, Robert Glaeser, Thomas Earnest, and Wolfgang Baumeister, "insight: review article From words to literature in structural proteomics," Nature 422, 216-225 (2003); doi: 10.1038/nature01513.
Ruedi Aebersold and Matthias Mann, "insight review articles, Mass spectrometry-based proteomics," Nature, vol. 422, Mar. 13, 2003, pp. 198-207.
Barbara Marte, Senior Editor, "Nature insight Proteomics," Nature vol. 422, Mar. 13, 2003 pp. 191-194.
Eric Phizicky, Philippe I. H. Bastiaens, Heng Zhu, Michael Snyder, and Stanley Fields, "insight: review article Protein analysis on a proteomic scale," Nature 422, 208-215 (2003); doi: 10.1038/nature01512.
Qingqing Liang, et al., "Accurate ac Transistor Characterization to 110 GHz Using a New Four-port Self-Calibrated Extraction Technique," IEEE, 2004 Topical Meeting on Silicon Monolithic Integrated Circuits in RF Systems, pp. 282-285.
Francesc Purroy and Lluis Pradell, "New Theoretical Analysis of the LRRM Calibration Technique for Vector Network Analyzers," IEEE Transactions on Instrumentation and Measurement, vol. 50, No. 5, Oct. 2001, pp. 1307-1313.
Christophe Risacher, et al., "Wavequide-to-Microstrip Transition With Integrated Bias-T," IEEE Microwave and Wireless Components Letters, vol. 13, No. 7, Jul. 2003, pp. 262-264.
Saswata Basu and Leonard Hayden, "An SOLR Calibration for Accurate Measurement of Orthogonal On-Wafer DUTS," 1997 IEEE MTT-S Digest, pp. 1335-1338.
J. Martens, "Multiport SOLR Calibrations: Performance and an Analysis of Some Standards Dependencies," pp. 205-213, Anritsu Company, 490 Jarvis Drive, Morgan Hill, CA 95037, jmartens@anritsu.com.
Deming Xu, Liping Liu, and Zhiyan Jiang, "Measurement of the Dielectric Properties of Biological Substances Using an Improved Open-Ended Coaxial Line Resonator Method," IEEE Transactions on Microwave Theory and Techniques, vol. MTT-35, No. 12, Dec. 1987, pp. 1424-1428.
Mohammed Nurul Afsar, James R. Birch, and R. N. Clarke, "The Measurement of the Properties of Materials," Proceedings of the IEEE, vol. 74, No. 1, Jan. 1986, pp. 183-199.
M.S. Venkatesh and G.S.V. Raghavan, "An overview of dielectric properties measuring techniques," vol. 47, 2005, Canadian Biosystems Engineering, pp. 7.15-7.30.
Andrzej W. Kraszewski, Stuart O. Nelson, and Tian-Su You, "Use of a Microwave Cavity for Sensing Dielectric Properties of Arbitrarily Shaped Biological Objects," IEEE Transactions on Microwave Theory and Techniques, vol. 338, No. 7, Jul. 1990, pp. 858-863.
Leonard Hayden, "A Multi-Line TRL Calibration," Feb. 2, 1994, 5 pages.
Christophe Seguinot, et al., "Multimode TRL—A New concept in Microwave Measurements: Theory and Experimental Verification," IEEE Transactions On Microwave Theory and Techniques, vol. 46, No. 5, May 1998, pp. 536-542.
Roberto Tinti, Franz Sischka, and Chris Morton, "Proposed System Solution for 1/f Noise Parameter Extraction," Agilent Technologies Comms EDA, 1400 Fountaingrove Pkw, Santa Rosa, CA 95403, 7 pages.
Robert D. Grober, Robert J. Schoelkopf, and Daniel E. Prober, "Optical antenna: towards a unity efficiency near-field optical probe," Appl. Phys. Lett. 70 (11), Mar. 17, 1997, 1997 American Insitute of Physics, pp. 1354-1356.
Cascade Microtech, "Probe Heads Care and cleaning of coaxial input microwave probes," Microwave Probe Care and Cleaning, Instruction Manual, Copyright 1990.
The Micromanipulator Company, data sheet, Double Sided Probing System, Jul. 2002, 2 pages.

* cited by examiner

ON-WAFER TEST STRUCTURES FOR DIFFERENTIAL SIGNALS

CROSS-REFERENCE TO RELATED APPLICATIONS

This application claims the benefit of U.S. Provisional Application No. 60/813,099, filed Jun. 12, 2006.

BACKGROUND OF THE INVENTION

The present invention relates to integrated circuits and, more particularly to, test structures and methods for on-wafer inspection of integrated circuits and other microelectronic devices.

Integrated circuits (ICs) comprise an arrangement of basic passive and active circuit elements, such as transistors, resistors and capacitors that are fabricated on a substrate or wafer. ICs are fabricated by a process of successively depositing layers of semi-conductive, conductive or insulating materials on the wafer and selectively etching portions of the deposited material. Deposition of a semi-conductor, conductor or insulator is followed by deposition of a layer of photosensitive material. The photosensitive material is exposed to light, through a precisely aligned mask, causing portions of the material to be chemically altered. Portions of the exposed photosensitive material are removed producing a photoresist layer with a pattern corresponding to the mask. A chemical etchant, applied to the surface, selectively removes the underlying semi-conductive, conductive or insulating layer except in those areas which are protected by the remaining photoresist. The remaining portions of the semi-conductor, conductor or insulator comprise a layer of one or more of the stratified, passive or active circuit elements. The photoresist layer is removed from the exposed surface of the wafer and the process is repeated until all of the strata of the circuit's elements have been laid down.

Referring to FIG. 1, typically, a plurality of dies 22, each comprising one or more integrated circuits, are formed on the surface of a wafer or substrate 20. Following fabrication, the individual dies are separated or singulated, typically by sawing the wafer along scribe or saw streets (indicated by a bracket) 24 between the dies. Each die containing a marketable integrated circuit is encased in a package and electrical connections are provided between the exterior of the package and the integrated circuit on the enclosed die. The. separation and packaging of a die comprises a significant portion of the cost of manufacturing an integrated circuit device. To monitor and control the fabrication process and avoid the cost of packaging defective dies, manufacturers commonly add electrical circuits or test structures 26 to the wafer that enable on-wafer inspection before the dies are singulated.

A wafer typically includes a plurality of test structures 26 that are distributed about the surface of the wafer enabling a portion of the wafer containing a defect to be isolated and identified by the testing. Referring to FIG. 2, a test structure 40 typically comprises a device under test (DUT) 42, a plurality of bond or probe pads 44 and a plurality of vias 46 connecting the probe pads on the surface of the substrate 20 to the circuit elements of the DUT which are typically fabricated beneath the surface. A DUT typically comprises a simple circuit that includes a copy of one or more of the basic elements of the marketable integrated circuit, such as a single line of conducting material, a chain of vias or a single transistor. The circuit elements of the DUT are typically produced with the same process and in the same layers of the wafer as corresponding elements of the marketable ICs. The marketable ICs are typically characterized "on-wafer" by applying a test instrument generated signal to the test structure and measuring the response of the test structure to the signal. Since the circuit elements of the DUT are fabricated with the same process as the corresponding elements of the integrated circuit, the electrical properties of the DUT are expected to be representative of the electrical properties of the corresponding components of the marketable ICs.

Many integrated circuits utilize single ended or ground referenced signaling that is referenced a ground plane, typically, at the lower surface of the substrate on which the active and passive devices of the circuit are fabricated. As a result of the physical make up of the devices of an integrated circuit, parasitic interconnections exist between many of the parts of the individual devices and between parts of the devices and the wafer on which the devices are fabricated. These interconnections are commonly capacitive and/or inductive in nature and have frequency dependent impedances. For example, the terminals of transistors fabricated on semi-conductive substrates or wafers are typically capacitively interconnected, through the substrate, to the ground plane. The impedance of this parasitic capacitive interconnection is frequency dependent and at higher frequencies the ground potential and the true nature of ground referenced signals becomes uncertain.

Balanced or differential devices utilizing differential signals are more tolerant to poor radio frequency (RF) grounding than single ended devices making them attractive for high performance ICs. A differential gain cell 50 is a balanced device comprising two nominally identical circuit halves 50A, 50B. When the transistors 52 of the differential gain cell are biased with a dc voltage, for example from a current source 54, and stimulated with a differential mode signal, comprising even ($S_i^{+1}$) and odd ($S_i^{-1}$) mode components of equal amplitude and opposite phase, a virtual ground is established at the symmetrical axis 56 of the two circuit halves. At the virtual ground, the potential at the operating frequency does not change with time regardless of the amplitude of the stimulating signal. The quality of the virtual ground of a balanced device is independent of the physical ground path and, therefore, balanced or differential circuits can tolerate poor RF grounding better than circuits operated with single ended signals. In addition, the two waveforms of the differential output signal ($S_o^{+1}$ and $S_o^{-1}$) are mutual references providing faster and more certain transitioning from one binary value to the other for digital devices and enabling operation with a reduced voltage swing for the signal. Moreover, balanced or differential circuits have good immunity to noise, including noise at even-harmonic frequencies, because noise from external sources, such as adjacent conductors, tends to couple, electrically and electromagnetically, in the common mode and cancel in the differential mode and signals that are of opposite phase at the fundamental frequency are in phase at the even harmonics. Improved tolerance to poor RF grounding, increased resistance to noise and reduced power consumption make differential devices attractive for ICs that operate at higher frequencies. A differential gain cell is a common elemental device of differential or balanced circuits and a test structure comprising a differential gain cell enables on wafer testing and characterization of differential devices included in marketable ICs fabricated on the wafer.

As illustrated in FIG. 1, test structures are often fabricated on areas of the wafer that could otherwise be occupied by one or more dies containing the marketable integrated circuits. However, manufacturers face continuous pressure to reduce the cost of IC devices by increasing the number of dies fabricated on a wafer. Since the test structures serve no purpose after the dies are singulated, manufacturers have sought to locate the test structures in the saw streets between dies and, at the same time, to reduce the width of the saw streets to maximize utilization of the substrate's surface area.

While a DUT is usually small, the size of the test structure is typically determined by the area occupied by the probe pads. Test structures incorporating balanced devices typically require large areas of the wafer's surface because five probe pads 80, 82, 84, 86, 88 are required to sink and source the four differential signal components and bias the device. Two probes 60, 62 are required to facilitate simultaneous engagement of five probe pads with five probe tips 70, 72, 74, 76, 78. The probe pads of a differential test structure are typically arranged around the perimeter of the area in which the DUT is fabricated enabling a probe to be positioned on either side of the test structure. The size and separation of the individual probe pads are dictated by the need to co-locate the probe pads and the probe tips during testing and avoid interference between the adjacent conductors. Likewise, facilitating engagement of the probe pads with two probes and avoiding crosstalk between the two closely located probes dictates the separation between the rows of probe pads on either side of the test structure. However, locating two sets of interconnected probe pads in a saw street for simultaneous engagement by two probes that are relatively large compared to the features on the wafer has proven to be difficult.

What is desired, therefore, is a test structure including a DUT useful for testing integrated circuits comprising differential or balanced devices which can be fabricated in the saw streets between dies on a wafer or substrate.

DETAILED DESCRIPTION OF PREFERRED EMBODIMENTS

Figure 1:
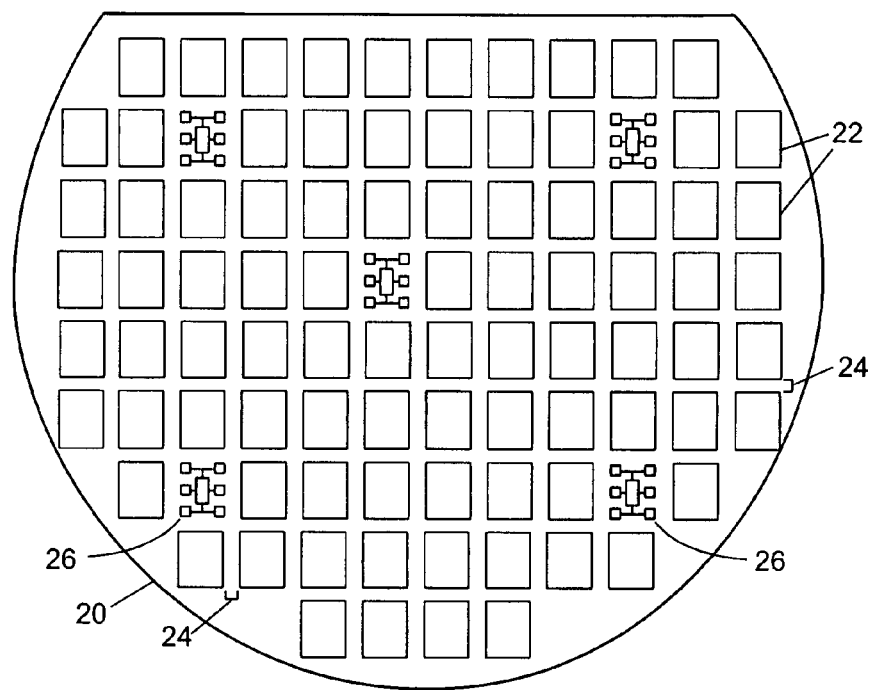
FIG. 1 is a top view of an exemplary wafer on which integrated circuits are fabricated.

The expected operation of integrated circuits (ICs) is commonly predicted by on-wafer characterization. The characterization is commonly performed by stimulating a test structure with a signal generated by a test instrument and measuring the signal produced in response to the stimulation. The test structure typically comprises a device-under-test (DUT) conductively connected to a plurality of probe or bond pads located on the surface of the wafer on which the marketable ICs are fabricated. The DUT typically comprises a relatively simple circuit that includes one or more active or passive circuit elements that correspond to circuit elements included in the marketable ICs. Much of the circuitry of the DUT is typically fabricated below the surface of the wafer with the same process of successive deposition and etching of layers of conductive, semi-conductive and insulating materials that is used to fabricate the corresponding components of the marketable ICs. Since the components of the DUT are fabricated with the same process that is used to produce the components of the marketable ICs, it is anticipated that the operation of the DUT, when stimulated by the test signal, will be representative of the operation of the corresponding components of the ICs if stimulated by a similar signal.

Interconnections between the test instrumentation and the DUT commonly exhibit frequency dependent electrical characteristics or parasitics which must be accounted for, particularly, at high frequencies, if the operation of the DUT is to be determined accurately. For example, the probes that commonly enable temporary connection of the instrumentation to the test structure typically comprise a plurality of interconnected transmission lines of differing types and each transition can produce a frequency dependent effect on the signal. Within the test structure, vias connecting the probe pads, deposited at the surface of the wafer, to the components of the DUT, located below the wafer's surface, have a finite inductance. As a result, the admittances of the vias are frequency dependent and must be accounted for to enable accurate measurement of the DUT's operation. A process known as "de-embedding" in which the test instrumentation is used to stimulate and measure the response of a plurality of known sample test structures is widely used to mathematically account for these effects so that the signals at the input and output terminals of the DUT can be accurately assessed.

However, some parasitics also arise internally in the DUT making de-embedding difficult or impossible and the frequency dependent effects of these parasitics may make assessment of the signal at the DUT's terminals unreliable. Integrated circuits are commonly unbalanced devices that utilize single ended (ground referenced) signals. Typically, the lower surface of the wafer serves as the ground plane for the circuit devices, including devices in a test structure, that are fabricated on the upper surface of the substrate. However, the terminals of circuit elements fabricated on semi-conductive substrates are capacitively interconnected through the substrate to the substrate's lower surface. The impedance of the capacitive interconnections to the circuit's ground plane varies with frequency producing uncertainty concerning the ground potential and, therefore, the true nature of the single ended signals at the terminals of the DUT particularly at higher frequencies, such as radio frequencies (RF).

Figure 2:
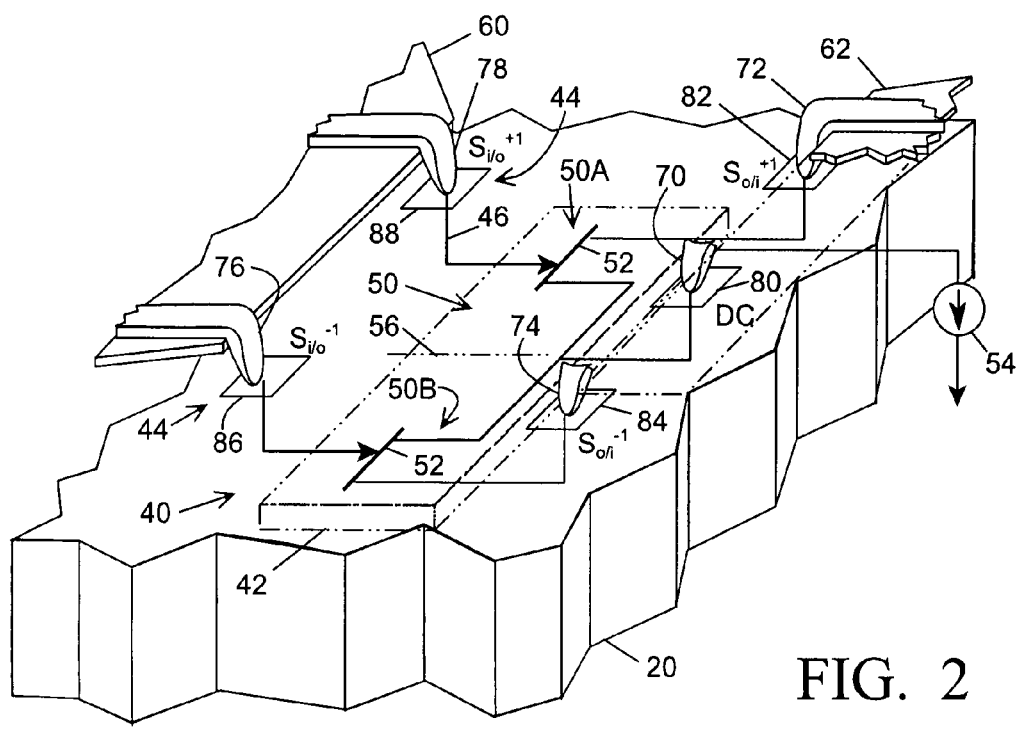
FIG. 2 is a perspective view of a portion of a substrate comprising a test structure including a differential gain cell and a fragmentary representation of two probes arranged to probe the test structure.

A balanced device, responsive to differential signals, is known to be more tolerant than an unbalanced device to ground potential variation such as that encountered during operation at higher frequencies. Referring in detail to the drawings where similar parts are identified by like reference numerals, and, more particularly to FIG. 2, a differential gain cell 50, a balanced device, comprises two nominally identical circuit halves 50A, 50B. When biased with a DC voltage, from a source such as a current source 54 or another potential referenced to ground, and stimulated with a differential mode signal, comprising even ($S_i^{+1}$) and odd ($S_i^{-1}$) mode components of equal amplitude and opposite phase, a virtual ground is established at the symmetrical axis 56 of the two circuit halves. At the virtual ground, the potential at the operating frequency does not change with time regardless of the amplitude of the stimulating signal. The quality of the virtual ground of a balanced device is independent of the physical ground path and, therefore, balanced or differential circuits can tolerate poor radio frequency (RF) grounding better than circuits operated with single ended signals. In addition, noise from external sources, such as adjacent conductors, tends to couple, electrically and electromagnetically, in the common mode and cancel in the differential mode. As a result, balanced or differential circuits have good immunity to noise including noise at even-harmonic frequencies since signals that are of opposite phase at the fundamental frequency are in phase at the even harmonics.

While balanced devices provide enhanced signal integrity at higher frequencies and reduced interference from external noise, the use of balanced devices in DUTs of test structures is limited. Two probes 60, 62 are typically required to supply the DC bias to the balanced device and to conduct the phase or even mode and anti-phase or odd mode components of the differential input signals to the device and the even mode and odd mode components of the differential output signals from the device. A test structure comprising a balanced device is typically relatively large to accommodate at least five probe pads 80, 82, 84, 86, 88 and probing with two probes. The inventors concluded that if a test structure comprising a balanced or differential device could be fabricated in a saw street between dies and probed with a single probe the area of the surface of the substrate that is useable for fabricating marketable ICs could be substantially increased, reducing the cost of fabricating and testing ICs that utilize differential signaling.

Figure 3:
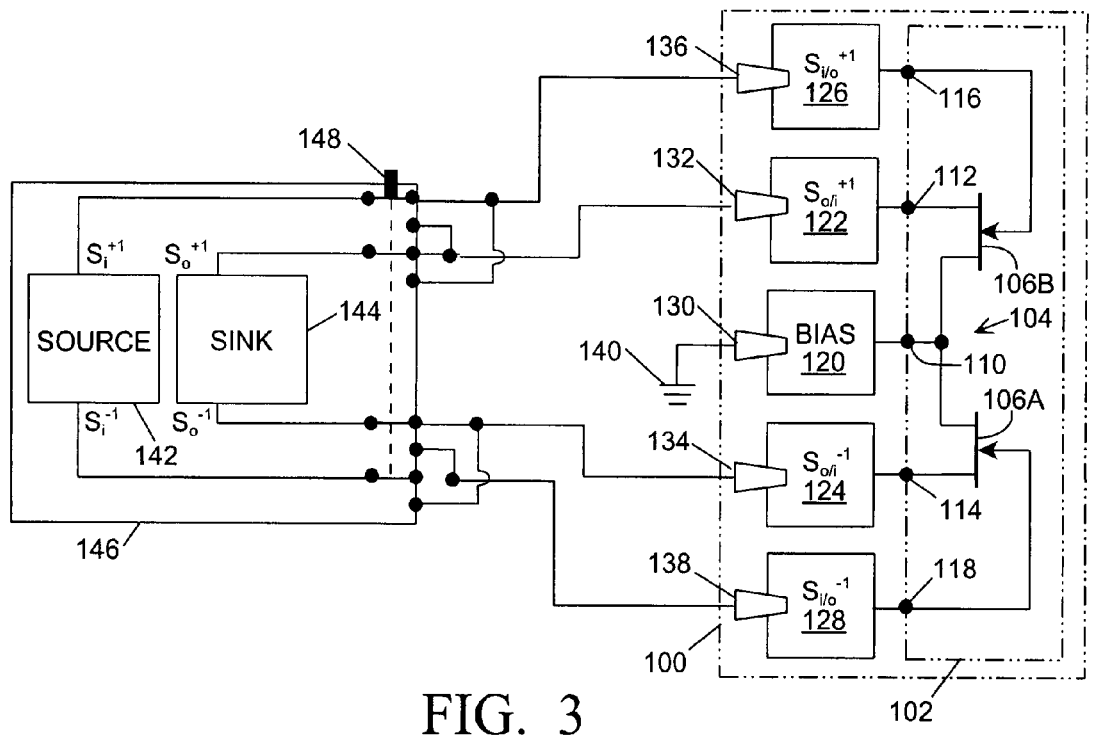
FIG. 3 is a schematic illustration of a probe measurement system for testing a differential test structure.
Figure 8:
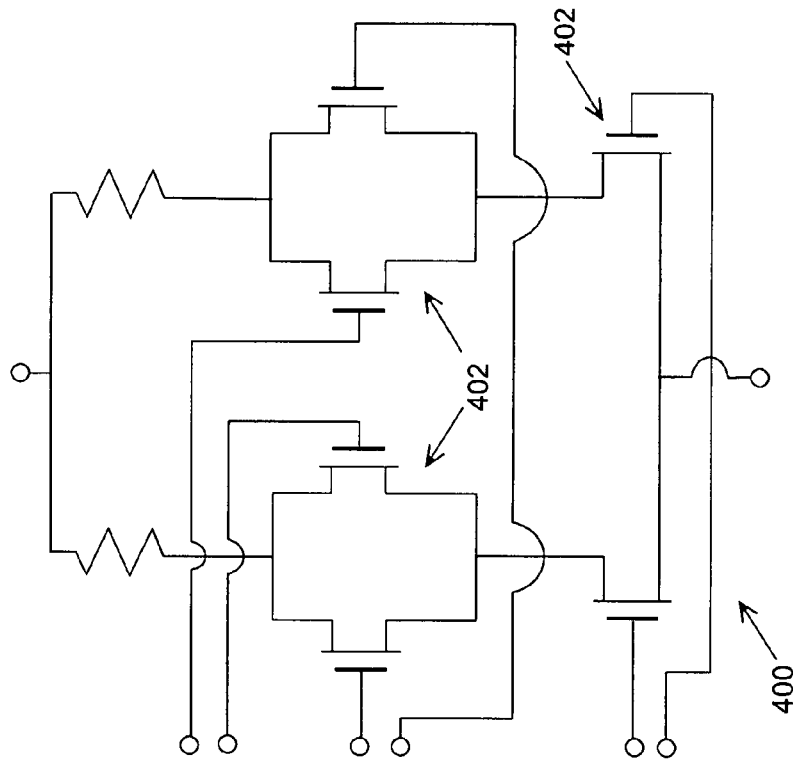
FIG. 8 is a schematic illustration of a Gilbert cell.

Referring to FIG. 3, the test structure 100 comprises a DUT 102 that includes a differential gain cell 104 that is responsive to a differential input signal. The differential input signal comprises an even mode component ($S_i^{+1}$) and an odd mode component ($S_i^{-1}$) that has substantially the same amplitude as the even mode component but which is opposite in phase of the even mode component. The differential gain cell 104 comprises two substantially identical field effect (JFET) transistors 106A and 106B. However, a DUT typically comprises components corresponding to the components utilized in the marketable integrated circuits fabricated on the wafer and, referring to FIGS. 5 and 6 other types of transistors, such as MOSFET transistors 252A, 252B or bipolar junction (BJT) transistors 304A, 304B can be used in the construction of the differential gain cell. Differential gain cells comprising pairs of transistors are common elementary devices used in differential circuitry and, referring to FIG. 8, differential gain cells 402 comprising pairs of transistors are commonly used in more complex circuits such as a Gilbert cell 400.

The source terminals of the transistors 106A and 106B are interconnected as a bias terminal 110 of the differential gain cell. The bias terminal is interconnected to a centrally located bias probe pad 120. The bias probe pad is interconnected, typically through a contact tip 130 of a probe, to a source of DC voltage, for example a ground 140 or a current mirror, which provides the DC bias for the transistors of the differential gain cell.

The gates of the transistors comprise a first pair of signal terminals 116,118 of the DUT and are connected to respective signal probe pads 126,128 which are, in turn, connectible, typically through respective contact tips 136,138 of a probe, to a test instrument 146, typically a network analyzer. The drains of the transistors of the differential gain cell comprise a second pair of signal terminals 112,114 of the DUT which are interconnected to respective probe pads 122, 124. These probe pads are connectible, typically, through contact tips 132,134 of a probe to the test instrument. The test instrument comprises, generally, a source 142 of a differential input signal to the DUT comprising an even mode component, $S_i^{+1}$, and an odd mode component, $S_i^{-1}$; a sink 144 for the differential output signal of the DUT comprising an even mode component, $S_o^{+1}$, and an odd mode component, $S_o^{-1}$. A reversing switch 148 enables reversing the connections between the test instrument's differential signal source and sink and the respective pairs of signal probe pads. With the reversing switch in the illustrated position, the components of the differential input signals ($S_i^{+1}$ and $S_i^{-1}$) are applied to probe pads 126 and 128 and sunk at the terminals 116 and 118 of the DUT and the output signals ($S_o^{+1}$ and $S_o^{-1}$) are sourced from the terminals 112 and 114 through the probe pads 122 and 124. By actuating the reversing switch, the input signals ($S_i^{+1}$ and $S_i^{-1}$) can be applied to probe pads 122 and 124 sinking the input signals at terminals 112 and 114. As a result, the output signal components ($S_o^{+1}$ and $S_o^{-1}$) are sourced from terminals 116 and 118 and transmitted from probe pads 126 and 128 to the sink of the test instrument. The operation of the test structure is typically tested by launching a differential input signal to one pair of signal terminals of the differential gain cell and capturing the differential and common mode output signals transmitted, in response to the input signal, from the other pair of signal terminals.

Figure 4:
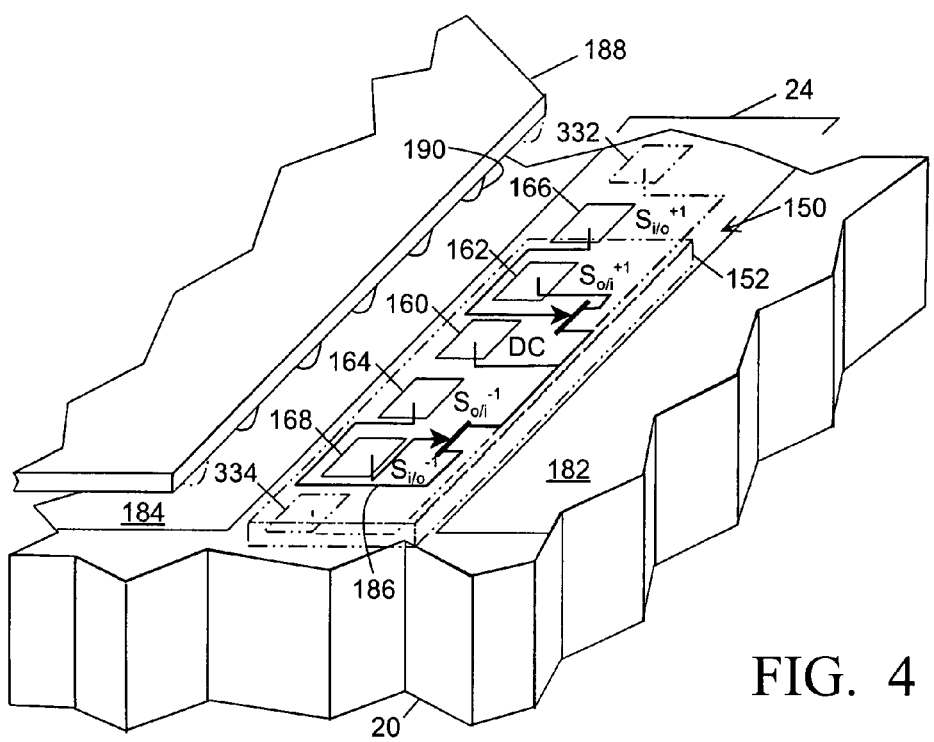
FIG. 4 is a perspective view of a portion of a substrate comprising a differential test structure including a linear array of probe pads.

While the test structure 40 can be fabricated in an area that could otherwise be occupied by one or more marketable ICs, the area required for the probe pads is too large to make locating the test structure in a saw street practical. The inventors concluded that a differential test structure could be fabricated in a saw street between dies on a wafer by arranging the four signal probe pads of the structure in a linear array such that the probe pads could be contacted by respective probe tips of a movable probe. The probe tips have contact areas with centroids arranged in a substantially straight line. Further, signal transmission for the test structure would benefit from a substantially symmetrical arrangement of signal probe pads in relation to one or more bias probe pads which may also be included in the linear array of probe pads. Referring to FIG. 4, the test structure 150 can be fabricated in an area of the wafer that would otherwise be occupied by a die containing a marketable IC. However, advantageously, the test structure 150 may be fabricated in a saw street 24 (indicated by a bracket) bounded by dies 182,184 fabricated on a substrate 20. Typically, the DUT 152 is relatively small and comprises circuit elements that are fabricated beneath the final surface of the wafer. Five probe pads 160,162,164,166, and 168 through which the DUT is biased and through which the differential signals are communicated to and from the DUT are arranged in a linear array with each probe pad of the array located proximate at least one other probe pad of the array and with the centroids of the probe pads being arranged in a substantially straight line. The probe pads of the test structure comprise a linear array of two pairs of signal probe pads; a pair of input/output probe pads 166,168 and a pair of output/input probe pads 162,164; that are arranged substantially symmetrical with one or more bias probe pads. The linear array of probe pads enables placement of the test structure in a saw street only slightly wider than the probe pads. The probe pads are accessible with a single movable probe 188 having a plurality of contact tips 190 arranged to be co-locatable with respective probe pads and having contact points or areas with centroids arranged in a substantially straight line. The probe pads are conductively connected to respective terminals of the DUT by vias 186 that extend from the surface of the wafer to the subsurface strata in which the circuit elements of the DUT are fabricated.

Figure 5:
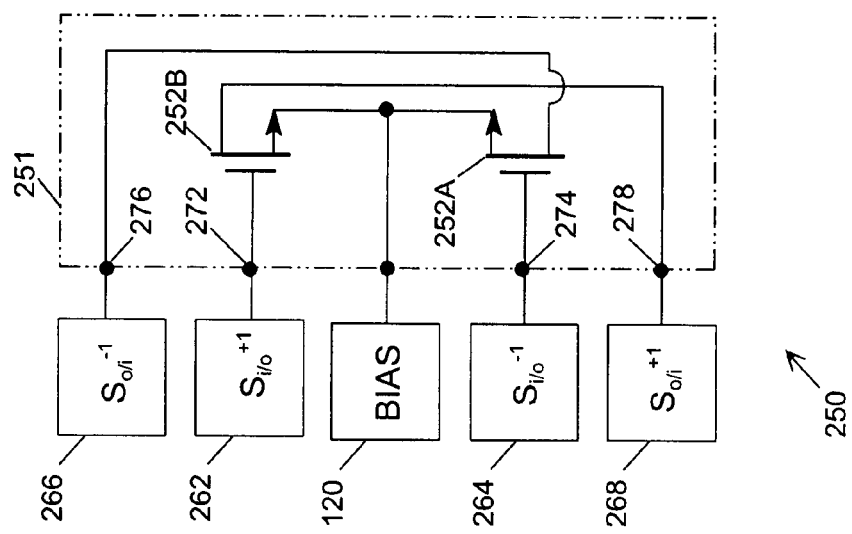
FIG. 5 is a schematic illustration of a second embodiment of a differential test structure including a linear array of probe pads.

In the test structure 100, the modes of the input and output signals at adjacent probe pads are the same. For example, sinking the even mode input signal ($S_i^{+1}$) at the probe pad 126 causes the even mode output signal ($S_o^{+1}$) to be transmitted from probe pad 122. Referring to FIG. 5, in a second embodiment of the test structure 250 the mode of the input and output signals at adjacent probe pads are inverted. For example, when the odd mode input signal ($S_i^{-1}$) is applied to the probe pad 264 and the even mode input signal ($S_i^{+1}$) is applied to probe pad 262, the even mode output signal ($S_o^{-1}$) is transmitted from probe pad 268 adjacent to probe pad 264 and the odd mode output signal ($S_o^{-1}$) is transmitted from the probe pad 266 adjacent to probe pad 262. The gates of the transistors 252B, 252A of the DUT 251 are connected, respectively, to the second signal terminal 272 and the third signal terminal 274. The drain of the transistor 252B is connected to the fourth signal terminal 278 which is interconnected to probe pad 268 and the drain of transistor 252A is connected to the first signal terminal 276 and probe pad 266. As a result, the modes of the input and output signals at adjacent probe pads are inverted.

Figure 6:
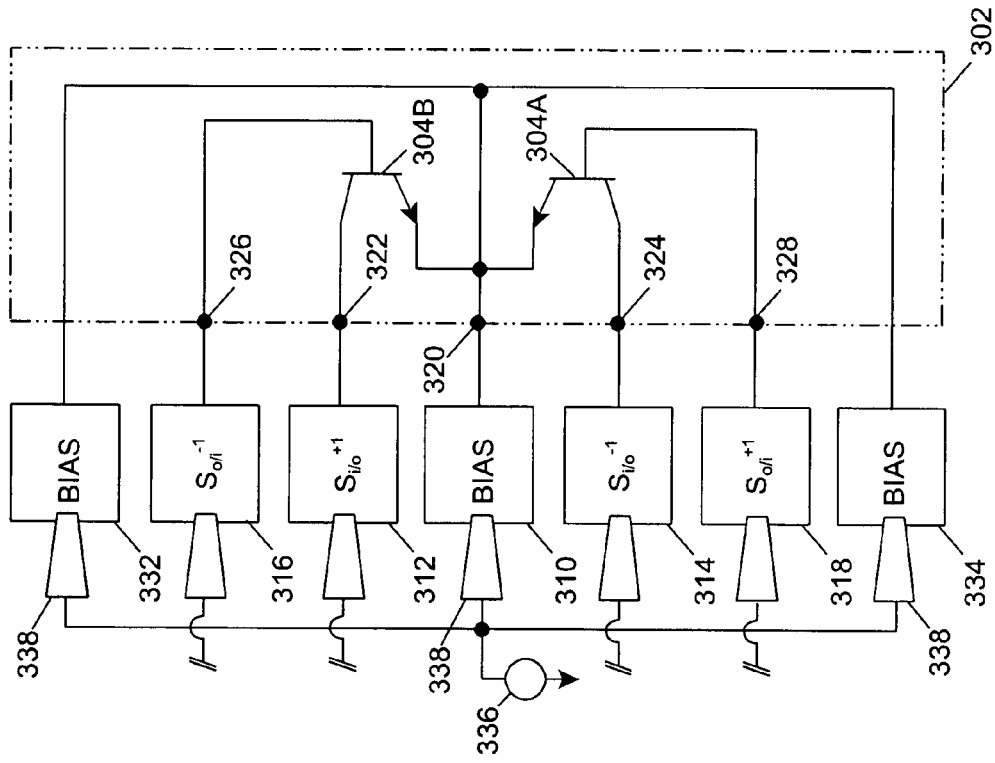
FIG. 6 is a schematic illustration of a third embodiment of a differential test structure including a linear array of probe pads.

An additional alternative embodiment of the differential test structure 300 with linearly arrayed probe pads is illustrated in FIG. 6. The additional embodiment comprises a DUT 302 including a differential gain cell comprising matched BJT transistors 304A, 304B. The gates of the transistors comprise the first and fourth differential signal terminals 326, 328 of the DUT and are conductively interconnected to respective probe pads 316, 318 through which a differential mode signal can be sunk or sourced. Correspondingly, a differential signal can be respectively sourced or sunk through the probe pads 312 and 314 which are interconnected, respectively, to the second and third signal terminals 322 and 324 of the DUT comprising the respective collectors of the differential cell transistors. The interconnected emitters of the two transistors comprise the bias terminal 320 of the DUT. Bias is provided to the differential gain cell at a centrally located probe pad 310 that is interconnected to the bias terminal. The bias terminal is also conductively interconnected to a pair of probe pads 332, 334 that are located at the respective ends of the linear array of probe pads and which are connectable, through respective probe tips 338, to the source of DC bias 336 for the DUT. The additional DC biased probe pads at the respective ends of the linear array of probe pads improve the symmetry of the electromagnetic fields and reduce the crosstalk between the signal probe pads and the centrally located bias probe pad.

Figure 7:
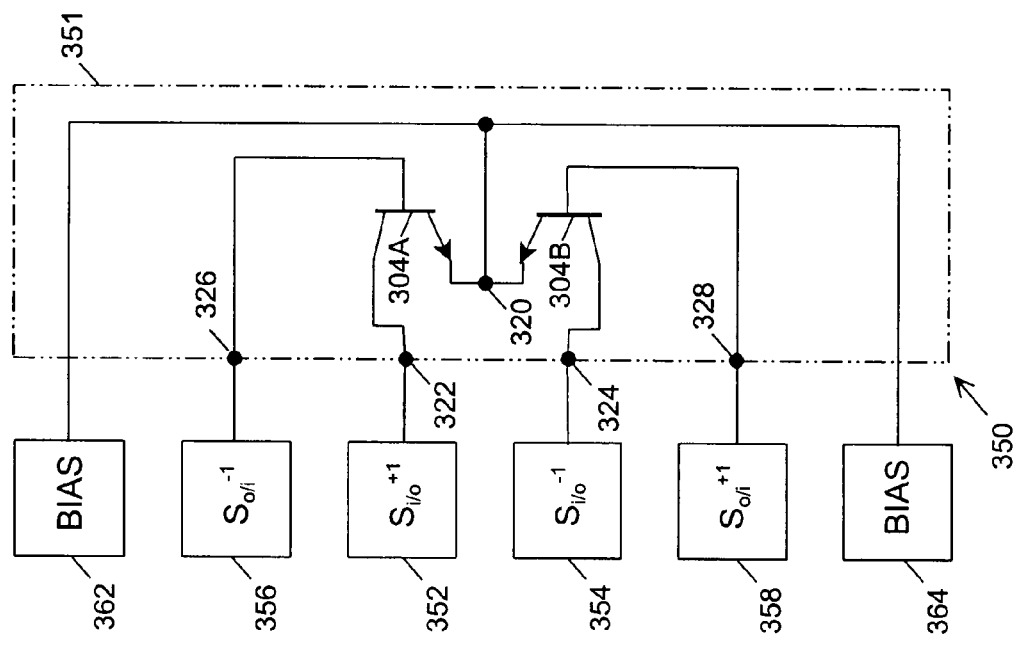
FIG. 7 is a schematic illustration of a fourth embodiment of a differential test structure including a linear array of probe pads.

Referring to FIG. 7, an additional embodiment of the differential test structure 350 comprises a linear array of six probe pads 352, 354, 356, 358, 362, 364. The differential input and output signals are conducted to and from the signal probe pads 352, 354 which are interconnected to the first pair of signal terminals 322, 324 connected to the collectors of the transistors 304A and 304B of the DUT 351 and signal probe pads 356, 358 which are interconnected to the second pair of signal terminals 326, 328 connected to the bases of the transistors. The emitters of the transistors are connected to the bias terminal 320 of the cell which is in turn connected to bias probe pads 362, 364 at the extremes of the linear array of probe pads. The DC biased probe pads at the respective ends of the linear array of probe pads provide symmetry in the electromagnetic fields and the centrally located bias probe pad is eliminated reducing the length of the linear array of probe pads.

Figure 9:
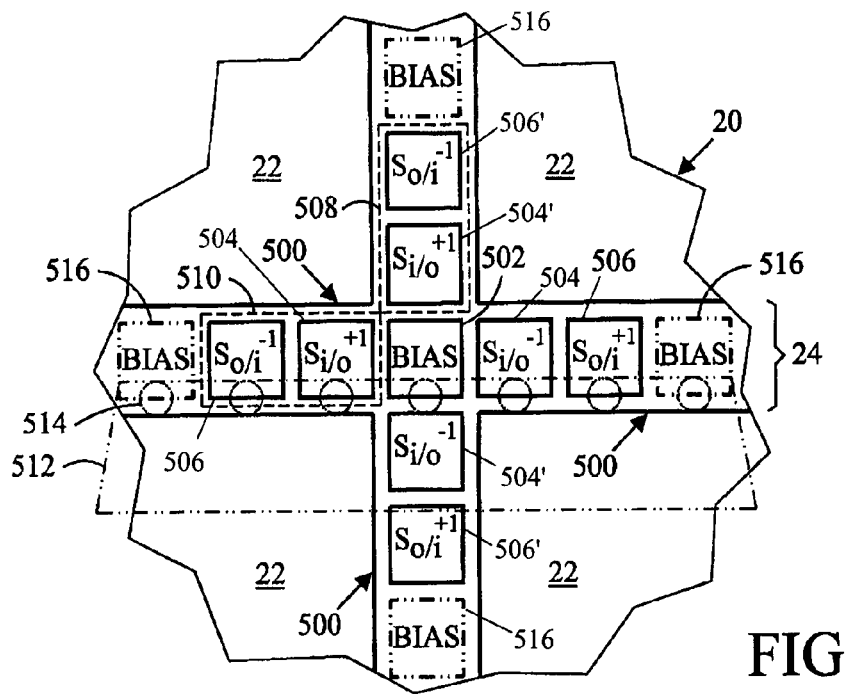
FIG. 9 is a top view of a portion of wafer including a pair of differential test structures fabricated at an intersection of two saw streets.
Figure 10:
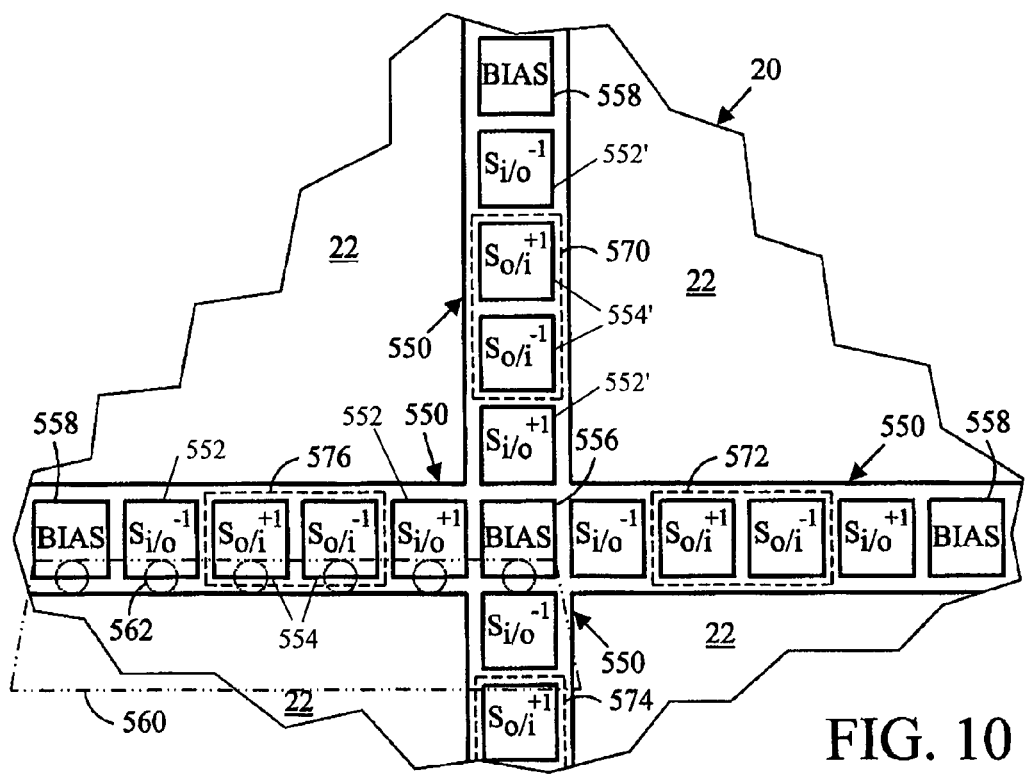
FIG. 10 is a top view of a portion of wafer including another pair of differential test structures fabricated at an intersection of two saw streets.

The test structures can be further concentrated by locating the linear arrays of probe pads at the intersections of saw streets 24 between dies 22 on a wafer 20. Referring to FIG. 9, the linear arrays 500 of probe pads comprise up to seven probe pads with a central bias probe pad 502 located between two pairs of signal probe pads 504, 506. The bias probe pad located in the intersection of the saw streets 24 can be common to a DUT 508 in the north-south saw street and a DUT 510 located in the east-west saw street because the probe tips 514 of the probe 512 are arranged supply signals to only one set of signal probe pads at a time. The probe pads of the test structures can include additional bias probe pads 516 at each end of each linear array of probe pads. Referring to FIG. 10, linear arrays of six probe pads 550 comprising two pairs of signal probe pads 552, 554 and a pair of bias probe pads 556, 558, one located at each end to the array, can be fabricated in the intersection of the east-west and north-south streets 24. The bias probe pad 556 in the intersection can be connected to each of the four DUTs 570, 572, 574, 576 in the streets leading to the intersection because the probe tips 562 of probe 560 will supply signals to the signal probe pads of only one array of probe pads at a time.

Figure 11:
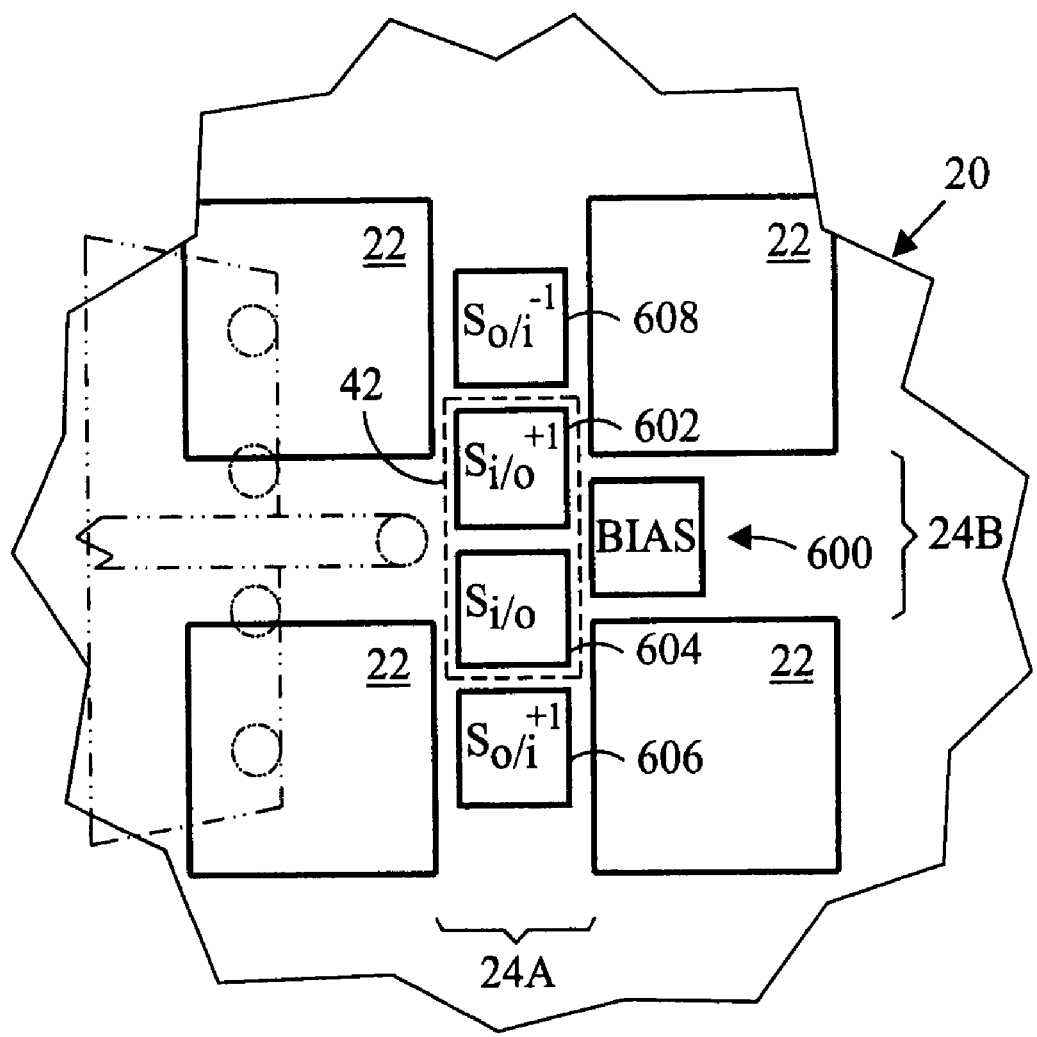
FIG. 11 is a top view of a portion of wafer including an additional embodiment of a differential test structure fabricated at an intersection of two saw streets.

FIG. 11 illustrates another embodiment of a compact differential test structure 600 fabricated at the intersection of saw streets 24A and 24B (indicated by brackets) separating a plurality of dies 22 on a substrate 20. The test structure comprises a DUT 42 fabricated below the surface of the wafer and a plurality probe pads. Four signal probe pads, comprising a pair of input/output probe pads 602 and 604 and a pair of output/input probe pads 606 and 608, are arranged in a linear array in a first saw street 24A. The four probe pads are co-locatable with respective contact areas of four probe tips 622, 624, 626, 628 on a probe 620. The contact areas of the four probe tips are arranged in a substantially straight line. The bias probe pad 610 is fabricated in the second saw street 24B such that it is co-locatable with a bias probe tip 630 of the probe 620. The probe pads of the pair of input/output signal probe pads 602, 604 and the pair of output/input probe pads 606, 608 are arranged substantially symmetrical with regard to the bias probe pad.

A test structure comprising a balanced or differential device and having a plurality of probe pads arranged in a linear array enables fabrication of the test structure in a saw street between dies increasing the area of the substrate available for fabricating marketable integrated circuits reducing the cost of the marketable ICs and the cost of on wafer characterization of the ICs.

The detailed description, above, sets forth numerous specific details to provide a thorough understanding of the present invention. However, those skilled in the art will appreciate that the present invention may be practiced without these specific details. In other instances, well known methods, procedures, components, and circuitry have not been described in detail to avoid obscuring the present invention.

All the references cited herein are incorporated by reference.

The terms and expressions that have been employed in the foregoing specification are used as terms of description and not of limitation, and there is no intention, in the use of such terms and expressions, of excluding equivalents of the features shown and described or portions thereof, it being recognized that the scope of the invention is defined and limited only by the claims that follow.

We claim:

1. A test structure for characterizing a circuit fabricated on a substrate, said test structure comprising:
   (a) a differential cell to output a differential output signal at a first signal terminal and a second signal terminal in response to application of a transistor bias voltage to a bias terminal and application of a differential input signal applied to a third signal terminal and a fourth signal terminal and, alternatively, to output a differential output signal at said third signal terminal and said fourth signal terminal in response to application of said bias voltage to said bias terminal and application of a differential input signal applied to said first signal terminal and said second signal terminal;
   (b) a first probe pad interconnected with said third signal terminal;
   (c) a second probe pad adjacent to said first probe pad and interconnected with said first signal terminal;
   (d) a third probe pad adjacent to said second probe pad and interconnected with said bias terminal;
   (e) a fourth probe pad adjacent to said third probe pad and interconnected to said second signal terminal; and
   (f) a fifth probe pad adjacent to said fourth probe pad and interconnected to said fourth signal terminal.

2. The test structure of claim 1 wherein said first, said second, said third, said fourth and said fifth probe pads are located within a saw street bounded by a first die and a second die.

3. The test structure of claim 1 wherein said differential input signal comprises a first input signal and a second input signal, said second input signal having a phase opposite said first input signal, and said differential output signal comprises a first output signal and a second output signal, said second output signal having a phase opposite said first output signal, and said phase of said signal at said first probe pad is inverted relative to said phase of said signal at said second probe pad.

4. The test structure of claim 1 wherein said differential input signal comprises a first input signal and a second input signal, said second input signal having a phase opposite said first input signal, and said differential output signal comprises a first output signal and a second output signal, said second output signal having a phase opposite said first input signal, and said phase of said signal at said first probe pad is the same as said phase of said signal at said second probe pad.

5. The test structure of claim 1 wherein said first, said second, said third, said fourth and said fifth probe pads are arrayed substantially linearly on said wafer.

6. The test structure of claim 5 wherein said probe pads of said linear array are located within a saw street bounded a first die and a second die fabricated on said substrate.

7. A test structure for characterizing a circuit fabricated on a substrate, said test structure comprising:
   (a) a differential cell to output a differential output signal at a first signal terminal and a second signal terminal in response to application of a transistor bias voltage to a bias terminal and application of a differential input signal applied to a third signal terminal and a fourth signal terminal and, alternatively, to output a differential output signal at said third signal terminal and said fourth signal terminal in response to application of said bias voltage to said bias terminal and application of a differential input signal applied to said first signal terminal and said second signal terminal;
   (b) a first probe pad interconnected to said bias terminal;
   (c) a second probe pad adjacent to said first probe pad and interconnected with said third signal terminal;
   (d) a third probe pad adjacent to said second probe pad and interconnected with said first signal terminal;
   (e) a fourth probe pad adjacent to said third probe pad and interconnected with said bias terminal;
   (f) a fifth probe pad adjacent to said fourth probe pad and interconnected to said second signal terminal;
   (g) a sixth probe pad adjacent to said fifth probe pad and interconnected to said fourth signal terminal;
   (h) a seventh probe pad adjacent to said sixth probe pad and interconnected to said bias terminal.

8. The test structure of claim 7 wherein said first, said second, said third, said fourth, said fifth, said sixth and said seventh probe pads are located within a saw street bounded by a first die and a second die.

9. The test structure of claim 7 wherein said differential input signal comprises a first input signal and a second input signal, said second input signal having a phase opposite said first input signal, and said differential output signal comprises a first output signal and a second output signal, said second output signal having a phase opposite said first output signal, and said phase of said signal at said second probe pad is inverted relative to said phase of said signal at said third probe pad.

10. The test structure of claim 7 wherein said differential input signal comprises a first input signal and a second input signal, said second input signal having a phase opposite said first input signal, and said differential output signal comprises a first output signal and a second output signal, said second output signal having a phase opposite said first output signal, and said phase of said signal at said second probe pad is the same as said phase of said signal at said third probe pad.

11. The test structure of claim 7 wherein said first, said second, said third, said fourth and said fifth, said sixth and said seventh probe pads are arrayed substantially linearly on said wafer.

12. The test structure of claim 11 wherein said probe pads of said linear array are located within a saw street bounded a first die and a second die fabricated on said substrate.

13. A test structure for characterizing a circuit fabricated on a substrate, said test structure comprising:
   (a) a differential cell to output a differential output signal at a first signal terminal and a second signal terminal in response to application of a transistor bias voltage to a bias terminal and application of a differential input signal applied to a third signal terminal and a fourth signal terminal and, alternatively, to output a differential output signal at said third signal terminal and said fourth signal terminal in response to application of said bias voltage to said bias terminal and application of a differential input signal applied to said first signal terminal and said second signal terminal;
   (b) a first probe pad interconnected to said bias terminal;
   (c) a second probe pad adjacent to said first probe pad and interconnected with said third signal terminal;
   (d) a third probe pad adjacent to said second probe pad and interconnected with said first signal terminal;
   (e) a fourth probe pad adjacent to said third probe pad and interconnected to said second signal terminal;
   (f) a fifth probe pad adjacent to said fourth probe pad and interconnected to said fourth signal terminal; and
   (g) a sixth probe pad proximate said fifth probe pad and interconnected to said bias terminal.

14. The test structure of claim 13 wherein said first, said second, said third, said fourth, said fifth and said sixth probe pads are located within a saw street bounded by a first die and a second die.

15. The test structure of claim 13 wherein said differential input signal comprises a first input signal and a second input signal, said second input signal having a phase opposite said first input signal, and said differential output signal comprises a first output signal and a second output signal, said second output signal having a phase opposite said first output signal, and said phase of said signal at said second probe pad is inverted relative to said phase of said signal at said third probe pad.

16. The test structure of claim 13 wherein said differential input signal comprises a first input signal and a second input signal, said second input signal having a phase opposite said first input signal, and said differential output signal comprises a first output signal and a second output signal, said second output signal having a phase opposite said first output signal, and said phase of said signal at said second probe pad is the same as said phase of said signal at said third probe pad.

17. The test structure of claim 13 wherein said first, said second, said third, said fourth and said fifth and said sixth probe pads are arrayed substantially linearly on said wafer.

18. The test structure of claim 17 wherein said probe pads of said linear array are located within a saw street bounded a first die and a second die fabricated on said substrate.

* * * * *